US012633340B1

(12) United States Patent
Kanj et al.

(10) Patent No.: US 12,633,340 B1
(45) Date of Patent: May 19, 2026

(54) BLEEDER AND RESET FOR STATIC RANDOM ACCESS MEMORY

(71) Applicant: SYNOPSYS, INC., Sunnyvale, CA (US)

(72) Inventors: Rouwaida Nawaf Kanj, Cedar Park, TX (US); Jamil Kawa, Mountain View, CA (US)

(73) Assignee: SYNOPSYS, INC., Sunnyvale, CA (US)

( * ) Notice: Subject to any disclaimer, the term of this patent is extended or adjusted under 35 U.S.C. 154(b) by 322 days.

(21) Appl. No.: 18/238,434

(22) Filed: Aug. 25, 2023

(51) Int. Cl.
*G11C 11/419* (2006.01)
*G11C 11/412* (2006.01)
*H10B 10/00* (2023.01)

(52) U.S. Cl.
CPC .......... *G11C 11/419* (2013.01); *G11C 11/412* (2013.01); *H10B 10/12* (2023.02)

(58) Field of Classification Search
CPC ...... G11C 11/419; G11C 11/412; H10B 10/12
USPC ........................................................ 365/154
See application file for complete search history.

(56) References Cited

U.S. PATENT DOCUMENTS

2018/0204626 A1* 7/2018 Kumar ................... G11C 5/143
2024/0331768 A1* 10/2024 Verma ................... G11C 11/419

OTHER PUBLICATIONS

Anagnostopoulos, N.A., et al. "Low-temperature Data Remanence Attacks Against Intrinsic SRAM PUFs," 2018 21$^{st}$ Euromicro Conference on Digital System Design, 2018, pp. 581-585.
Barriendos, Elia Mateu. "Analysis of Data Remanence and Power-up States of SRAM Cells in Embedded Systems," Masters Thesis, Escola Technica Superior d'Enginyeria Industrial de Barcelona, Sep. 2022, 112 pages.
Carbone, et al. "An In-depth Analysis of the Cold Boot Attack: Can it be Used for Sound Forensic Memory Acquisition," Defence R&D Canada—Valcartier Technical Memorandum, Jan. 2011, 118 pages.
Giterman, R., et al. "A 7T Security Oriented SRAM Bitcell," IEEE Transactions on Circuits and Systems,—II: Express Briefs, Aug. 2019, vol. 66, No. 8, pp. 1396-1400.
Halderman, et al. "Lest We Remember: Cold Boot Attacks on Encryption Keys," 17$^{th}$ Usenix Security Symposium, Jul. 2008, pp. 45-60.
Han, Seong-Joo, et al. "Ultra-fast Data Sanitization of SRAM by Back-biasing to Resist a Cold Boot Attack," Nature Scientific Reports, 2002, vol. 12, 10 pages.
Kai, Y., et al. "Security Strategy of Powered-off SRAM for Resisting Physical Attack to Data Remittance," Journal of Semiconductors, Sep. 2009, vol. 30, No. 9, 5 pages.

(Continued)

*Primary Examiner* — Huan Hoang
*Assistant Examiner* — Daniel John King
(74) *Attorney, Agent, or Firm* — Womble Bond Dickinson (US) LLP

(57) ABSTRACT

A circuit including: a memory cell connected to a first power supply configured to supply a first power supply voltage; a first bleeder transistor coupled between a first node of the memory cell and ground; and a second circuit coupled to a gate electrode of the first bleeder transistor and configured to supply a bleeder signal to control the first bleeder transistor in response to a drop in the first power supply voltage, wherein the first bleeder transistor is configured to discharge the memory cell in response to receiving the bleeder signal.

19 Claims, 17 Drawing Sheets

(56)     References Cited

OTHER PUBLICATIONS

Mahmod, J. "SRAM Has No Chill: Exploiting Power Domain Separation to Steal On-Chip Secrets," ASPLOS '22, Feb. 28-Mar. 4, 2022, Lausanne, Switzerland, pp. 1043-1055.

Müller, T., et al. "FROST: Forensic Recovery of Scrambled Telephones," Oct. 2012, 19 pages.

Pagani, F. "Advances in Memory Forensics," Eurecom, Sep. 2019, 147 pages.

Skorobogatov, et al. "Low-Temperature Data Remanence in Static RAM," Technical Report, University of Cambridge Computer Laboratory, No. 536, Jun. 2002, 9 pages.

Won, Y-S. et al. "Deep-Freeze: Cold Boot Attacks and High Fidelity Model Recovery on Commercial EdgeML Device," 2021 IEEE/ACM International Conference on Computer Aided Design (ICCAD), 2021, 9 pages.

Zheng, Y. et al. "Rapid Reset 8-Transistor Physically Unclonable Function Utilising Power Gating," 2003 Design, Automation & Test in Europe Conference, 2023, 2 pages.

* cited by examiner (a)

BLEEDER AND RESET FOR STATIC RANDOM ACCESS MEMORY

TECHNICAL FIELD

The present disclosure relates to a memory device, and more particularly, present disclosure relates to a bleeder and reset for static random-access memory (SRAM).

BACKGROUND

Although in many cases it is assumed that a computer's random-access memory (RAM) is erased almost immediately when it loses power, or that it is difficult to retrieve remaining data from the RAM after a power loss event, these assumptions may be incorrect. Static and dynamic random access memory devices generally lose their contents gradually over a short period of time when the RAM chips are disconnected from power and kept at a standard operating temperature, such as when a computing system is turned off. However, data remaining in the RAM after a power loss event may persist for minutes or even hours if the RAM chips are kept at low temperatures.

The above information in the Background section is only for enhancement of understanding of the background of the technology and therefore it should not be construed as admission of existence or relevancy of the prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

In one or more embodiments, a circuit including: a memory cell connected to a first power supply configured to supply a first power supply voltage; a first bleeder transistor coupled between a first node of the memory cell and ground; and a second circuit coupled to a gate electrode of the first bleeder transistor and configured to supply a bleeder signal to control the first bleeder transistor in response to a drop in the first power supply voltage, wherein the first bleeder transistor is configured to discharge the memory cell in response to receiving the bleeder signal.

In one or more embodiments, the second circuit includes a first transistor and a capacitor, wherein a first electrode of the first transistor is connected to a first data line and a second electrode of the first transistor is connected to a first electrode of the capacitor, wherein a gate electrode of the first transistor is connected to a first word line, wherein a second electrode of the capacitor is connected to the ground, and the gate electrode of the first bleeder transistor is connected to the second circuit via a second transistor.

In one or more embodiments, a first electrode of the second transistor is connected to the second electrode of the first transistor and a first electrode of the capacitor; the second electrode of the second transistor is connected to the gate electrode of the first bleeder transistor via a second node; the gate electrode of the second transistor is connected to the first power supply voltage; and when the first power supply voltage is at a low level, the second circuit is configured to supply the bleeder signal to the gate electrode of the first transistor via the second transistor to turn on the first bleeder transistor.

In one or more embodiments, the first transistor is an n-type transistor and the second transistor is a p-type transistor.

In one or more embodiments, the second circuit is connected to one or more memory cells in a same row of a memory array including a plurality of memory cells, the one or more memory cells in the same row of the memory array being connected to a same word line, wherein the second circuit is connected to a portion of the plurality of memory cells of the memory array that are connected to the same word line, and wherein the portion of the plurality of memory cells of the memory array include a corresponding bleeder transistor to discharge a corresponding memory cell in response to the drop in the first power supply voltage.

In one or more embodiments, the first bleeder transistor is further coupled between a third node of the memory cell and the ground.

In one or more embodiments, the circuit further including a third transistor coupled between the ground and the first power supply, wherein: a first electrode and a gate electrode of the third transistor is electrically coupled to the first power supply and a second electrode of the third transistor is connected to the ground; and wherein the third transistor is a n-type transistor.

In one or more embodiments, the circuit further including a third transistor and an inverter, wherein: an input of the inverter is connected to a first electrode of the third transistor; an output of the inverter is connected to a gate electrode of the third transistor; a second electrode of the third transistor is connected to the ground; the inverter is configured to receive the first power supply voltage and convert the first power supply voltage to a second power supply voltage, and supply the second power supply voltage to the gate electrode of the third transistor; the second power supply voltage being a complementary voltage of the first power supply voltage; and the third transistor is configured to discharge voltage or charge stored in the first power supply when the first power supply is switched off.

In one or more embodiments, wherein the memory cell includes: a first inverter and a second inverter cross coupled with the first inverter, the first inverter and the second inverter being connected between the first power supply and the ground; a first access transistor coupled between a second data line and the first node, the first node being between an output of the first inverter and an input of the second inverter; and a second access transistor coupled between a third data line and a third node, the third node being between an output of the second inverter and an input of the first inverter, wherein gate electrodes of the first access transistor and the second access transistor are connected to a second word line, the second word line crossing the second data line and the third data line, and wherein the first access transistor, the second access transistor, and the first bleeder transistor are n-type transistors.

In one or more embodiments, a memory cell including: a first logic gate configured to receive a first power supply voltage from a first power supply; a first inverter cross coupled with the first logic gate; a first access transistor coupled between a first data line and a first node, the first node being between an output of the first logic gate and an input of the first inverter; and a second access transistor coupled between a second data line and a second node, the second node being between an output of the first inverter and a first input of the first logic gate, wherein gate electrodes of the first access transistor and the second access transistor are connected to a first word line, wherein the first logic gate is configured to reset the memory cell in response to receiving a reset signal at a second input of the first logic gate when the first power supply is switched off.

In one or more embodiments, the second input of the first logic gate is connected to a reset signal line configured to supply the reset signal to reset the memory cell when the first power supply is switched off or to reset the memory cell upon reboot when the first power supply is switched on.

In one or more embodiments, the reset signal line is configured to receive the reset signal from a second circuit including a first transistor and a capacitor, wherein a first electrode of the first transistor is connected to a third data line and a second electrode of the first transistor is connected to a first electrode of the capacitor, wherein a gate electrode of the first transistor is connected to a second word line, and wherein a second electrode of the capacitor is connected to ground.

In one or more embodiments, a portion of a memory array including a plurality of memory cells include a corresponding first logic gate to reset a corresponding memory cell in response to the reset signal when the first power supply is switched off.

In one or more embodiments, the first logic gate includes a first transistor, a second transistor, a third transistor, and a fourth transistor, wherein: a first electrode of the first transistor is connected to the first power supply, a second electrode of the first transistor is connected to a first electrode of the second transistor, and a gate electrode of the first transistor is connected to the second node; a first electrode of the second transistor is connected to the second electrode of the first transistor, a second electrode of the second transistor is connected to a first electrode of the third transistor and a first electrode of the fourth transistor, and a gate electrode of the second transistor is connected to a reset signal line configured to supply the reset signal, a first electrode of the third transistor is connected to the second electrode of the second transistor, a second electrode of the third transistor is connected to ground, and a gate electrode of the third transistor is connected to the reset signal line; a first electrode of the fourth transistor is connected to the second electrode of the second transistor and the first electrode of the third transistor, a second electrode of the fourth transistor is connected to the ground, and a gate electrode of the fourth transistor is connected to the second node; and the first electrode of the third transistor and the first electrode of the fourth transistor are connected to the first node.

In one or more embodiments, the memory cell further including a first transistor and an inverter, wherein: an input of the inverter is connected to a first electrode of the first transistor; an output of the inverter is connected to a gate electrode of the first transistor; a second electrode of the first transistor is connected to ground; the inverter is configured to receive the first power supply voltage and convert the first power supply voltage to a second power supply voltage, and supply the second power supply voltage to the gate electrode of the first transistor; the second power supply voltage being a complementary voltage of the first power supply voltage; and the first transistor is configured to discharge voltage or charge stored in the first power supply when the first power supply is switched off.

In one or more embodiments, a non-transitory computer readable medium including stored instructions, which when executed by a processor, cause the processor to generate a digital representation of a circuit including: a memory cell connected to a first power supply configured to supply a first power supply voltage; a first bleeder transistor coupled between a first node of the memory cell and ground; and a second circuit coupled to a gate electrode of the first bleeder transistor and configured to supply a bleeder signal to control the first bleeder transistor in response to a drop in the first power supply voltage, wherein the first bleeder transistor is configured to discharge the memory cell in response to receiving the bleeder signal.

In one or more embodiments, the second circuit includes a first transistor and a capacitor, wherein a first electrode of the first transistor is connected to a first data line and a second electrode of the first transistor is connected to a first electrode of the capacitor, wherein a gate electrode of the first transistor is connected to a first word line, wherein a second electrode of the capacitor is connected to the ground, and the gate electrode of the first bleeder transistor is connected to the second circuit via a second transistor.

In one or more embodiments, a first electrode of the second transistor is connected to the second electrode of the first transistor and a first electrode of the capacitor; the second electrode of the second transistor is connected to the gate electrode of the first bleeder transistor via a second node; the gate electrode of the second transistor is connected to the first power supply voltage; and when the first power supply voltage is at a low level, the second circuit is configured to supply the bleeder signal to the gate electrode of the first bleeder transistor via the second transistor and the second node to turn on the first bleeder transistor.

In one or more embodiments, the second circuit is connected to one or more memory cells in a same row of a memory array including a plurality of memory cells, the one or more memory cells in the same row of the memory array being connected to a same word line, and wherein a portion of the plurality of memory cells of the memory array include a corresponding bleeder transistor to discharge a corresponding memory cell in response to the drop in the first power supply voltage.

In one or more embodiments, the non-transitory computer readable medium further including a third transistor and an inverter, wherein: an input of the inverter is connected to a first electrode of the third transistor; an output of the inverter is connected to a gate electrode of the third transistor; a second electrode of the third transistor is connected to the ground; the inverter is configured to receive the first power supply voltage and convert the first power supply voltage to a second power supply voltage, and supply the second power supply voltage to the gate electrode of the third transistor; the second power supply voltage being a complementary voltage of the first power supply voltage; and the third transistor is configured to discharge voltage or charge stored in the first power supply when the first power supply is switched off.

BRIEF DESCRIPTION OF THE DRAWINGS

The present disclosure will be understood more fully from the detailed description given below and from the accompanying figures of embodiments of the present disclosure. The figures are used to provide knowledge and understanding of embodiments of the present disclosure and do not limit the scope of the present disclosure to these specific embodiments. Furthermore, the figures are not necessarily drawn to scale.

FIGS. 8A-8C also show the leakage when a $V_{DD}$ bleeder is added, and when a SRAM built-in bleeder is added.

DETAILED DESCRIPTION

Figure 1:
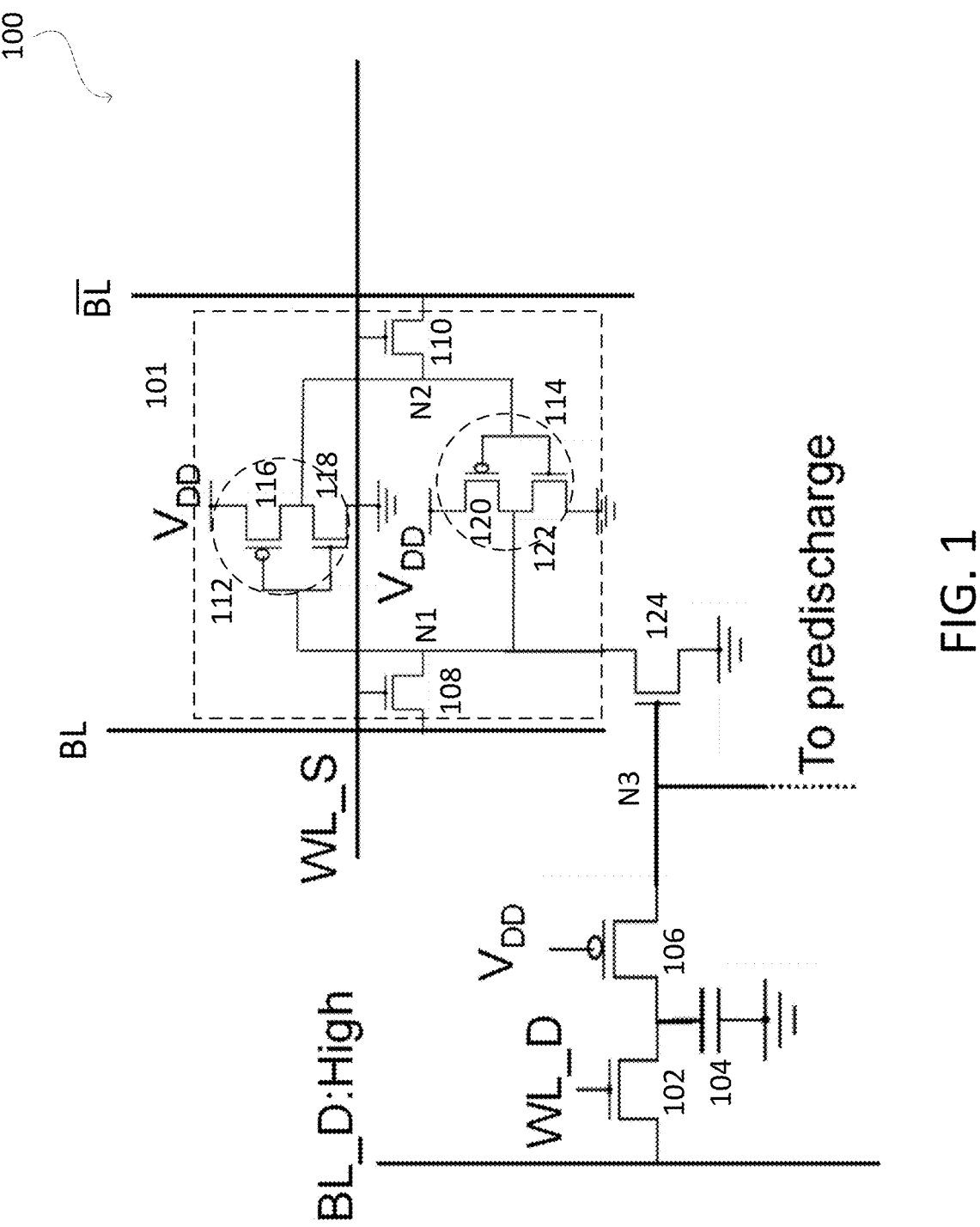
FIG. 1 illustrates an example static random-access memory (SRAM) cell design, according to one or more embodiments.

Aspects of the present disclosure relate to a bleeder and reset for static random-access memory (SRAM), which may be used to mitigate cold boot attacks and other types of attacks.

Although in many cases it is assumed that a computer's random-access memory (RAM) is erased almost immediately when it loses power, or that it is difficult to retrieve remaining data from the RAM after a power loss event, these assumptions may be incorrect. Static and dynamic random access memory devices generally lose their contents gradually over a period of time (e.g., milliseconds to seconds) when the RAM chips are disconnected from power and kept at a standard operating temperatures (e.g., room temperature). However, data remaining in the RAM after a power loss event may persist for minutes or even hours if the RAM chips are kept at a low temperature (e.g., put into a freezer or sprayed with compressed air such as a can of compressed carbon dioxide, which is commonly sold for dusting electronics). Remanence is function of temperature, power off time, and chip design. The less leaky the technology is the higher the remanence. Generally, the colder the RAM, the slower the data stored in the RAM fades away. Residual data can be recovered using simple, nondestructive techniques that require only momentary physical access to the computer. As such, the ability of an operating system to protect cryptographic key material from an attacker with physical access may become limited because the contents of the RAM are not immediately erased after the power loss event and because contents of the RAM persist for sufficiently enough time for malicious (or forensic) acquisition of usable full-system memory images.

When tampered with, volatile memory supply may be powered down or even shorted to ground. Accordingly, an attacker can retain and recover data from tampered volatile memory chips by using freezing agents, because the data that remains in the RAM after a power loss event may persist for minutes or even hours if the RAM chips are kept at a low temperature. This may be referred to as a cold boot attack. This puts at risk data like encryption keys or secret information, images, critical field internet of things (IoT) data, and the proprietary weights of that represent trained machine learning (ML) models.

Iterating over addresses after boot is slow and static random access memory (SRAM) cells remain at an uninitialized state after booting. Invalidating cache memory merely sets invalid bits to prevent cache hit but does not necessarily prevent extraction of data from the SRAM cells.

In some cases, forward-back biasing may be used to erase the content of the RAM, but this is limited and cannot be applied to a device with no body taps. In some other cases, an equalizer with a charge pump may be used to erase the content of the RAM. Encryption of the main memory may also be used to prevent data recovery in a cold boot attack. However, these solutions merely transfer the problem to protecting the memory module where the encryption keys are stored. Encryption also poses significant performance overheads and computational requirements that may not be achievable in low-power devices.

Hence, aspects of embodiments of the present disclosure relate to robust measures to counter data remanence recovery in a cold boot attack from uninitialized states.

One or more embodiments of the present disclosure provides solutions with respect to the security concerns that arise when chips with embedded RAM (e.g., SRAM) designs are subject to cold boot attack along with other forms of attack.

Technical advantages of the present disclosure include, but are not limited to, a memory with a bleeder device to disable recovery of the data and/or secret keys in the RAM due to cold boot attacks. One or more embodiments of the present disclosure may be implemented independently or may be implemented together for even more robust and/or faster outcomes. One or more embodiments of the present disclosure may include a bleeder device and a supporting circuit to counter data remanence during cold boot attacks, as will be discussed in more detail below. The bleeder device may turn on when the supply voltage is switched off or switched to ground upon tampering, and may reset or discharge the stored data of the RAM cells. In another embodiment, the bleeder fed from the remanent local supply voltage rails upon switch off activates to self-discharge the remanent voltage. The embodiments of the present disclosure may be an effective solution in case of a cold CMOS operation and/or a cold boot attack where the device threshold voltage increases further under cold boot attack resulting in very low leakages.

For designs where data is at high risk (for example, portable or IoT devices), the bleeder device of the one or more embodiments of the present disclosure may be embedded in the SRAM cell. For such an embodiment, as will be discussed in more detail below, a DRAM column is used to tap to part of the memory bank. When the supply voltage (e.g., VDD) drops, a PMOS pass transistor may be activated passing the DRAM charge to the bleed transistor resulting in data flip/cell reset (e.g., SRAM cell reset) prior to any data recovery.

Technical advantages of the present disclosure further include, but are not limited to, implementing the bleeder device to discharge the stored data of the RAM cells, where area is a concern, for efficient design. For example, as will be discussed in more detail below, in large memory arrays, the bleeder device can be applied to a local voltage supply configured to supply a high-level voltage (e.g., a supply voltage or VDD or a voltage higher than the supply voltage or VDD). A local inverter provides relatively low voltage leakage during normal operation. Upon switching off, the local supply node leaks slowly and this activates the bleeder fed by the inverter which in turn accelerates the discharge of the local supply node. In one or more embodiments of the present disclosure, a local VDD self-bleeder enables discharge of the internal supply lines and hence RAM cell nodes independent of the need for any external control signals or the need for any additional transistors within a six transistor or 6T SRAM cell. In one or more embodiments of the present disclosure, a DRAM cell and a PMOS transistor electrically coupled with each other may enable the generation of the within RAM cell reset capability upon attack.

One or more embodiments of the present disclosure may enable the reset of the SRAM using a NOR gate by replacing one of the SRAM latch inverters, as will be discussed in more detail below. One of the NOR inputs is fed from the SRAM (e.g., an other feedback inverter of the SRAM), and the other input of the NOR gate is fed from a reset signal. The reset signal allows bleeding when used in conjunction with the DRAM circuit discussed previously, as such it is activated when VDD is power off. In one or more other embodiments, a global reset signal can be activated, when the power is turned on, post attack, to reset the SRAM cell content upon reboot. The reset signal can also be used to guard against power analysis attack where all the array is reset prior to write to secret key locations, which prevents guessing the previously stored secret data based on write energy. This also guards against imprinting attack, where repeated identical writes may result in the SRAM cell booting to a critical old status, for example a key. Finally, one or more embodiments of the present disclosure may be used for data padding or zero padding the memory blocks, for example, for machine learning (ML) applications, to allow quick write '0' or '1' for a whole memory block.

FIG. 1 illustrates an example SRAM cell design with a bleeder circuit. For example, FIG. 1 illustrates an example SRAM cell design coupled with a DRAM cell designed to store a high voltage and a pass gate PMOS transistor designed to activate the SRAM cell bleeder upon supply power being turned off or switch off, according to one or more embodiments.

For example, the circuit 100 of FIG. 1 includes a SRAM cell 101, a bleeder transistor 124 connected to a node N1 of the SRAM cell 101, a transistor 106 connected to the gate electrode of the bleeder transistor 124 to connect the gate electrode of the bleeder transistor 124 with a DRAM cell represented by a transistor 102 and a capacitor 104.

In the embodiment of FIG. 1, the SRAM cell 101 includes six transistors 108, 110, 116, 118, 120, and 122. The bleeder transistor 124 is connected to the node N1 of the SRAM cell 101. Although FIG. 1 represents a six transistor or 6T SRAM cell design (e.g., SRAM cell 101), the bleeder design including the bleeder transistor 124 may be implemented in any other type of SRAM cell (e.g., an eight transistor or 8T SRAM cell, a ten transistor or 10T SRAM cell, or the like).

The SRAM cell 101 of FIG. 1 includes two cross coupled inverters 112 and 114 (e.g., the input terminal of the inverter 112 is connected to the output terminal of the inverter 114 and the input terminal of the inverter 114 is connected to the output terminal of the inverter 112). The inverter 112 includes a p-type transistor 116 and a n-type transistor 118. A first electrode of the transistor 116 is connected to a first power supply configured to supply a first supply level or higher voltage (e.g., VDD), and a second electrode of the transistor 116 is connected to a first electrode of the transistor 118. The second electrode of the transistor 118 is connected to the ground. The gate electrodes of the transistors 116 and 118 are connected to the node N1. The second electrode of the transistor 116 and the first electrode of the transistor 118 are connected to a node N2. The inverter 114 includes a p-type transistor 120 and a n-type transistor 122. A first electrode of the transistor 120 is connected to the first power supply configured to supply the first supply level or higher voltage (e.g., VDD), and a second electrode of the transistor 120 is connected to a first electrode of the transistor 122. The second electrode of the transistor 122 is connected to the ground. The gate electrodes of the transistors 120 and 122 are connected to the node N2. The second electrode of the transistor 120 and the first electrode of the transistor 122 are connected to the node N1. The SRAM cell 101 of FIG. 1 further includes a first access transistor 108 connected between a bit line (BL) and the node N1 and a second access transistor 110 connected between node N2 and a complement of the bit line ($\overline{BL}$). The gate electrodes of the transistors 108 and 110 are connected to a word line (WL_S). The transistors 108 and 110 are n-type transistors and the word line crosses the bit line (BL) and the complement of the bit line ($\overline{BL}$).

In the SRAM cell 101, the two access transistors 108 and 110 are used to write data to the SRAM cell 101 and to read the stored data in the SRAM cell 101. The transistors 108 and 110 are controlled (e.g., turned ON/OFF) by the word line (WL_S). In one or more embodiments, the word line (WL_S) is connected to the output of a row decoder circuit. When WL_S=VDD, the transistors 108 and 110 are turned on and connects the SRAM cell 101 to the bit line (BL) and the complement of the bit line ($\overline{BL}$) allowing both read and write operations.

According to one embodiment of the present disclosure, a bleeder transistor 124 is connected at the node N1 of the SRAM cell 101 to quickly discharge or reset the data stored in the SRAM cell 101 when the power supply is switched off (e.g., when $V_{DD}=0$). The bleeder transistor 124 is connected between the node N1 of the SRAM cell 101 and ground. The gate electrode of the bleeder transistor 124 is connected to a node N3, which is pre-discharged (e.g., any charge stored in the node N3 is discharged to the ground during normal operation of the circuit 100 when the power is on to ensure that the SRAM cell 101 is not disturbed during normal operation and the bleeder transistor 124 is controlled by the charge stored in the capacitor 104 in a power loss event). The bleeder transistor 124 only turns on in a power loss event (e.g., $V_{DD}=0$ or $V_{DD}$ leaking due to switch off to discharge or set node N1 of the SRAM cell 101 to the ground so that the data stored in the SRAM cell 101 cannot be recovered in a cold boot attack. The bleeder transistor 124 is a n-type transistor. In one or more embodiments, the bleeder transistor 124 may be connected instead at the node N2 to quickly discharge the data stored in the SRAM cell 101 when the power supply is switched off (e.g., when $V_{DD}=0$) and thereby reset the SRAM cell 101.

The transistor 102, which along with the capacitor 104 represents a DRAM cell, is connected between a bit line BL_D (at a high level) for the DRAM, and the capacitor 104 and the transistor 106. For example, a first electrode of the transistor 102 may be connected to the bit line BL_D (at a high level) for the DRAM and a second electrode of the transistor 102 may be connected to a first electrode of the capacitor 104 and a first electrode of the transistor 106. The second electrode of the capacitor 104 is connected to the ground and the second electrode of the transistor 106 is connected to the gate electrode of the bleeder transistor 124 via the node N3, which is pre-discharged. The transistor 102 is a n-type transistor and the transistor 106 is a p-type transistor. The gate electrode of the transistor 102 is connected to a word line (WL_D) for DRAM and the gate electrode of transistor 106 is connected to the first power supply configured to supply the first supply level or higher voltage (e.g., $V_{DD}$). When the word line (WL_D) is high, the transistor 102 is turned on and connects the bit line BL_D with the capacitor 104, which stores the data (e.g., stores the charge corresponding to the data) from the bit line BL_D. WL_D is maintained and is regularly turned ON during normal operation to ensure a properly charged capacitor 104.

Because transistor 106 is a p-type transistor, it is gated by $V_{DD}$ to detect drop in the supply nodes due to powering down or switching off the supply upon tampering, or it can be gated by a special signal that drops to ground when the memory chip including SRAM and DRAM is tampered with. For example, the special signal may be a signal designed to short to ground upon tampering of the SRAM cell 101 (for example, when sensing sudden unexpected drop in temperature of the SRAM cell 101 or when sensing removing the board (e.g., a circuit board containing the memory chip) from the SRAM cell 101, etc.). For example, the transistor 106 is turned on when a low-level voltage is applied to the gate electrode of the transistor 106 when $V_{DD}$ starts to drop in a power loss event. When transistor 106 is turned on, it connects the pre-charged capacitor 104 to the gate electrode of the bleeder transistor 124 via the node N3 and the charge stored in the capacitor 104 is transferred to the gate electrode of the bleeder transistor 124 via node N3 to turn on the bleeder transistor 124. Once the bleeder transistor 124 turns on, the node N1 (and/or, in some embodiments, node N2) is discharged to zero. As such, data stored in the SRAM cell 101 at node N1 is quickly discharged, which prevents data recovery in a cold boot attack. This results in flipping SRAM cell 101 content if the stored value is initially high at node N1 (e.g., by resetting the stored value at N1 to all zeros), thereby discharging node N1 and flipping node N2 to a higher value as the charge leaks slowly in the cold operating regimes. This is an expected behavior (e.g., of the SRAM cell 101 with the bleeder transistor 124), and in some cases, due to process variation, the flip may be slower or the SRAM cell 101 maybe biased for a specific value. As such, a bleeder transistor (e.g., the bleeder transistor 124) may be used to reset/set cell data in critical memory blocks where keys are stored or may be used to reset a part of the memory (e.g., at least 10% of the memory blocks) to prevent full data recovery by an attacker.

In one or more embodiments, the bleeder transistor 124 may also be connected at the node N2 (e.g., see FIG. 2) to quickly discharge the data stored in the SRAM cell 101 when the power supply is switched off (e.g., when $V_{DD}=0$). For example, in the embodiment of FIG. 1, the bleeder transistor 124 connected to the node N1 may perturb the stored data in the SRAM cell 101 and thereby reset the SRAM cell 101. If the SRAM cell 101 with the bleeder transistor 124 is subjected to a cold boot attack after a power loss event, the attacker will read a reset cell along with any noise effects resulting from process variations (if those process variation effects are sufficiently strong in this particular circuit).

In one or more embodiments of the present disclosure, the n-type transistors may be N-channel metal-oxide-semiconductor field-effect transistors (MOSFETs) and the p-type transistors may be P-channel MOSFETs.

Figure 2:
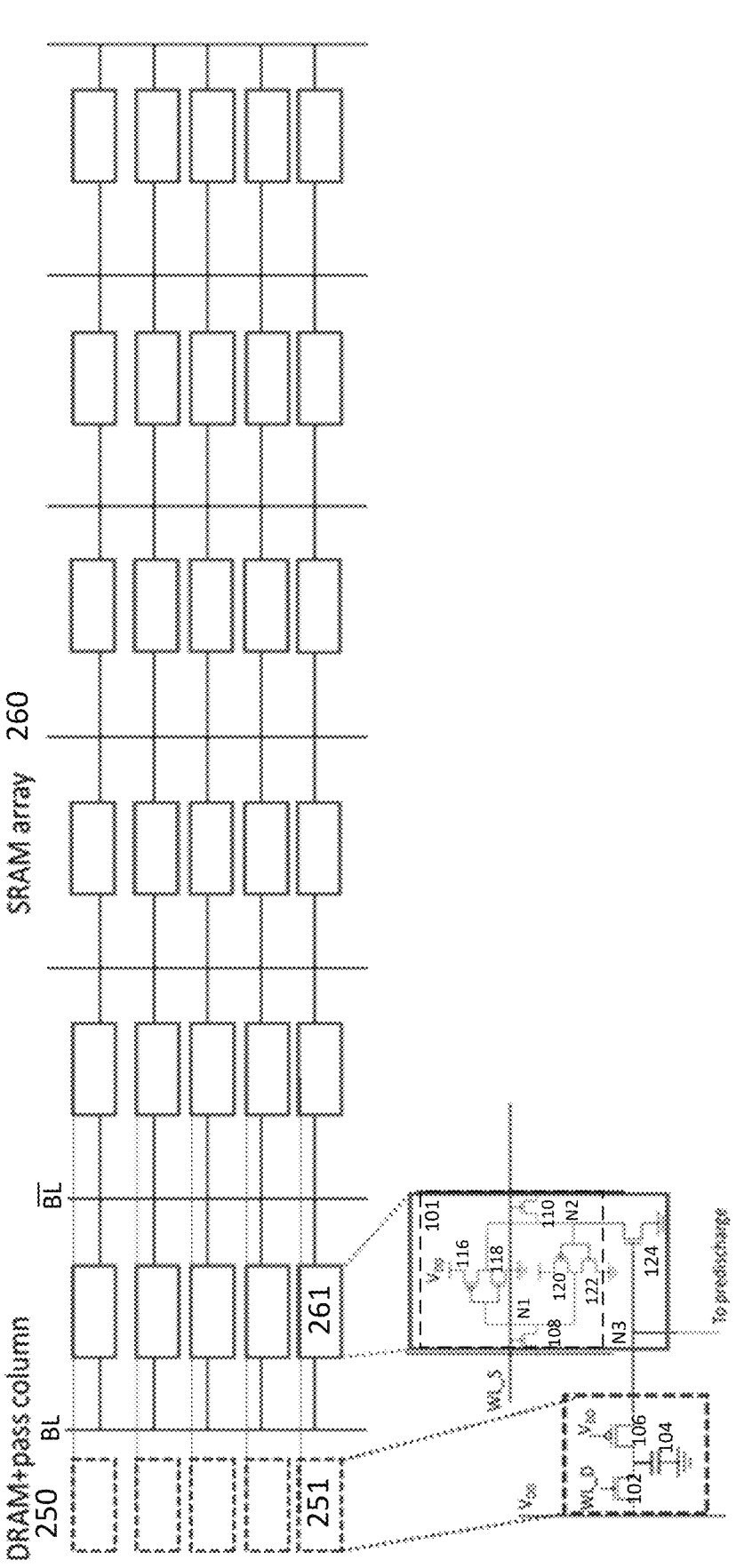
FIG. 2 illustrates a dynamic random-access memory (DRAM) array coupled to a SRAM array, according to one or more embodiments of the present disclosure.

FIG. 2 illustrates a DRAM array coupled to a SRAM array, according to one or more embodiments of the present disclosure. For example, FIG. 2 illustrates an example embodiment where a DRAM array, one or more columns, are coupled to part or all of a SRAM array. For example, FIG. 2 presents the embodiment FIG. 1 in the context of an SRAM array.

In FIG. 2, the SRAM array 260 includes a plurality of SRAM cells 261 (where each SRAM cell may, in some embodiments, be instance of the SRAM cell 101 discussed with respect to FIG. 1, although embodiments are not limited thereto), where each SRAM cell 261 in the SRAM array 260 has a node (e.g., node N1 or node N2 of the SRAM cell 101 as discussed with respect to FIG. 1) that is connected to a bleeder transistor (such as the bleeder transistor 124 described above with respect to FIG. 1). In FIG. 2, the DRAM array 250 includes a plurality of DRAM cells 251 each including a transistor and a capacitor that feed bleeder signals to the bleeder transistors of one or more SRAM cells 261 in a corresponding row of the SRAM array 260. In some embodiments, the transistor and the capacitor of the DRAM cell 251 may be arranged in a manner like that of the transistor 102 and the capacitor 104 coupled to the transistor 106 that drives the bleeder transistor 124 of each SRAM cell 101 as discussed with respect to FIG. 1).

In FIG. 2, the leftmost column 250 is the DRAM column feeding the bleeder signals to nodes N3 of one or more SRAM columns in the SRAM array 260. Bleeder signals may refer to signals (or charge stored in the capacitors of the DRAM cells) supplied to the bleeder transistors of the SRAM cells to enable the bleeder transistors connected to the SRAM cells.

For example, in FIG. 2, SRAM array 260 may include a plurality of SRAM cells arranged along rows and columns and connected to each other. Each of the plurality of SRAM cells in SRAM array 260 may be the SRAM cell 101 of FIG. 1. In some embodiments, node N3 may be connected to the bleeder transistors (e.g., bleeder transistor 124) of two or more SRAM cells in the SRAM array 260 to quickly discharge the data stored in those SRAM cells and reset the SRAM cells having the bleeder transistor (e.g., bleeder transistor 124). Not all SRAM cells have to have bleeder transistors and as such the size of the DRAM array can be smaller. For example, bleeder transistors (e.g., bleeder transistor 124) may be present for at least 10% of the SRAM cells in SRAM array 260, so that secret data (e.g., secret key/encryption key) stored in the SRAM array 260 cannot be recovered.

Figure 3A:
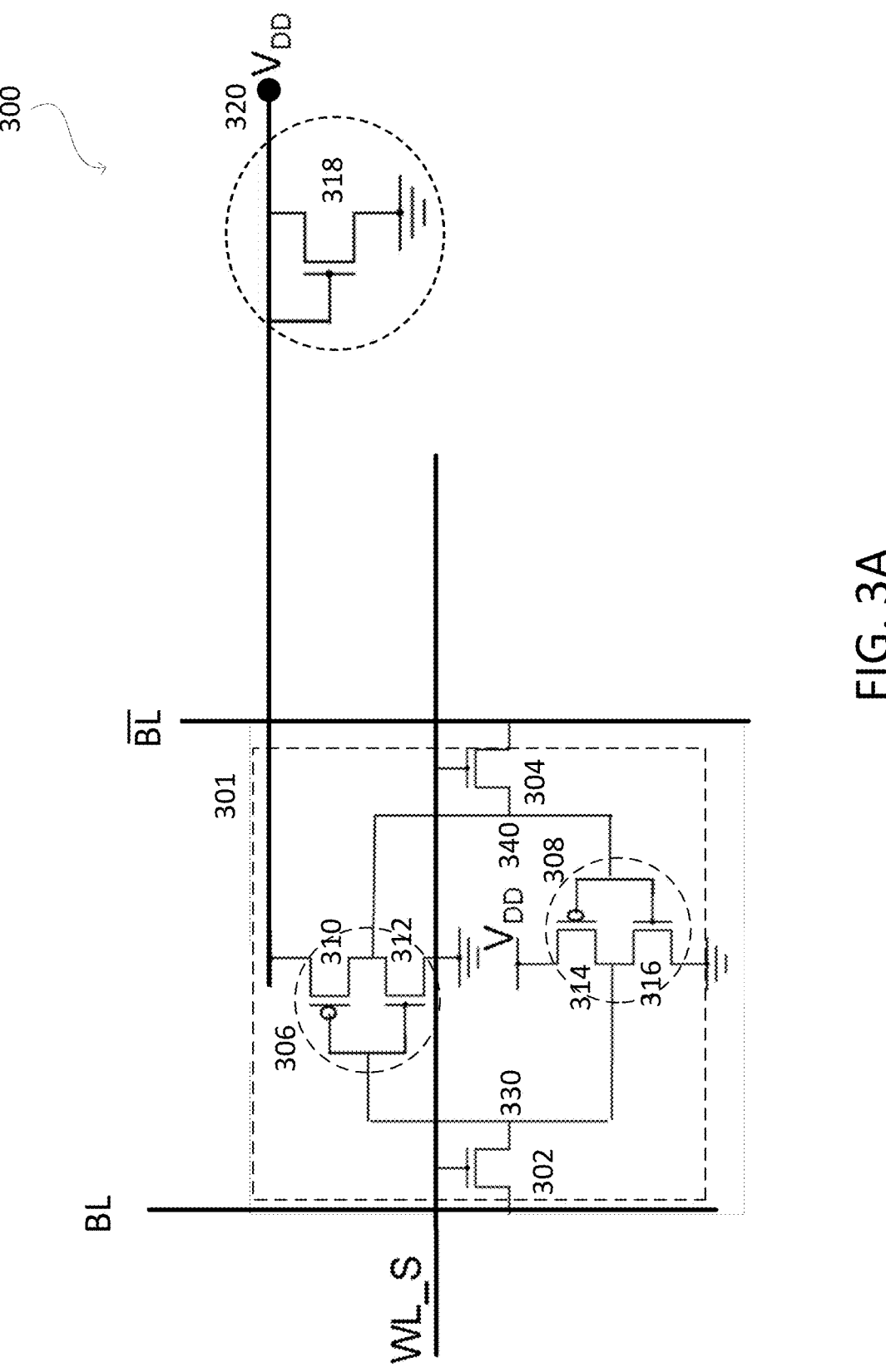
FIG. 3A illustrates an example SRAM cell design with a bleeder circuit connected to a first power supply, according to one or more embodiments of the present disclosure.

FIG. 3A illustrates an example SRAM cell design with a bleeder circuit connected to a first power supply line, according to one or more embodiments of the present disclosure.

For example, the circuit 300 of FIG. 3A includes a SRAM cell 301 and a bleeder transistor 318 connected to the supply line of SRAM cell 301 and a node 320 that is connected to the first power supply configured to supply the first supply level or higher voltage (e.g., $V_{DD}$). In one or more embodiments, in FIG. 3A, the first power supply, which is connected to the node 320, may be configured to supply the first supply level or higher voltage (e.g., $V_{DD}$) to a SRAM array (e.g., SRAM array 260 of FIG. 2) including a plurality of SRAM cells.

In the embodiment of FIG. 3A, the SRAM cell 301 may be similar to the SRAM cell 101 discussed with respect to FIG. 1. The SRAM cell 301 includes six transistors 302, 304, 310, 312, 314, and 316. The SRAM cell 301 of FIG. 3A includes two cross coupled inverters 306 and 308. The inverter 306 includes a p-type transistor 310 and a n-type transistor 312. A first electrode of the transistor 310 is connected to the node 320 connected to the first power supply (e.g., $V_{DD}$), and a second electrode of the transistor 310 is connected to a first electrode of the transistor 312. The second electrode of the transistor 312 is connected to the ground. The gate electrodes of the transistors 310 and 312 are connected to a node 330. The second electrode of the transistor 310 and the first electrode of the transistor 312 are connected to a node 340. The inverter 308 includes a p-type transistor 314 and a n-type transistor 316. A first electrode of the transistor 314 is connected to $V_{DD}$, and a second electrode of the transistor 314 is connected to a first electrode of the transistor 316. The second electrode of the transistor 316 is connected to the ground. The gate electrodes of the transistors 314 and 316 are connected to the node 340. The second electrode of the transistor 314 and the first electrode of the transistor 316 are connected to the node 330. The SRAM cell 301 of FIG. 3A further includes a first access transistor 302 connected between a bit line (BL) and the node 330 and a second access transistor 304 connected between the node 340 and a complement of the bit line ($\overline{BL}$). The gate electrodes of the transistors 302 and 304 are connected to a word line (WL_S). The transistors 302 and 304 are n-type transistors.

In the SRAM cell 301, the two access transistors 302 and 304 are used to access the stored data in the SRAM cell 301. The transistors 302 and 304 are turned ON/OFF by the control line called the word line (WL_S). In one or more embodiments, the word line (WL_S) is connected to the output of a row decoder circuit. When WL=$V_{DD}$, the transistors 302 and 304 are turned on and connects the SRAM cell 301 to the bit line (BL) and the complement of bit line ($\overline{BL}$) allowing both read and write operations. Read-write operations in the SRAM cell 301 is carried out by the help of access transistors 302 and 304.

In the embodiment of FIG. 3A, a bleeder transistor 318 is connected to the node 320 connected to the first power supply configured to supply the first supply level or higher voltage (e.g., $V_{DD}$). The bleeder transistor 318 is a n-type transistor whose gate and drain electrodes are connected to the node 320 connected to the first power supply configured to supply the first supply level or higher voltage (e.g., $V_{DD}$). When the first power supply is switched off, the voltage at node 320 connected to the first power supply starts to drop (or go down) from $V_{DD}$, while the bleeder transistor 318 stays ON until $V_{DD}$ drops below a threshold gate voltage ($V_{th}$) of the bleeder transistor 318, which helps the voltage of the node 320 connected to the first power supply to drop quickly. For example, when the first power supply is switched off, until $V_{DD}$ drops below the threshold gate voltage of the bleeder transistor 318, voltage (e.g., electric potential) at the node 320, which is connected to the first power supply, may be quickly discharged to the ground via the bleeder transistor 318. In one or more embodiments, a threshold gate voltage of the bleeder transistor 318 may be between 0.05 V and 0.1 V, where the threshold voltage may depend on, for example, the semiconductor process technology node used to manufacture the circuit.

In one or more embodiments, however, connecting a bleeder transistor (e.g., bleeder transistor 318) at the local power supply (e.g., the local power supply of the SRAM array) may increase current leakage (e.g., in uA range) via the bleeder transistor 318, as the bleeder transistor stays on the entire period of time during which the power supply is on. This can result in high current sunk from the power supply (e.g., the first power supply connected at node 320) when the power supply is switched on during regular operation mode.

Figure 3B:
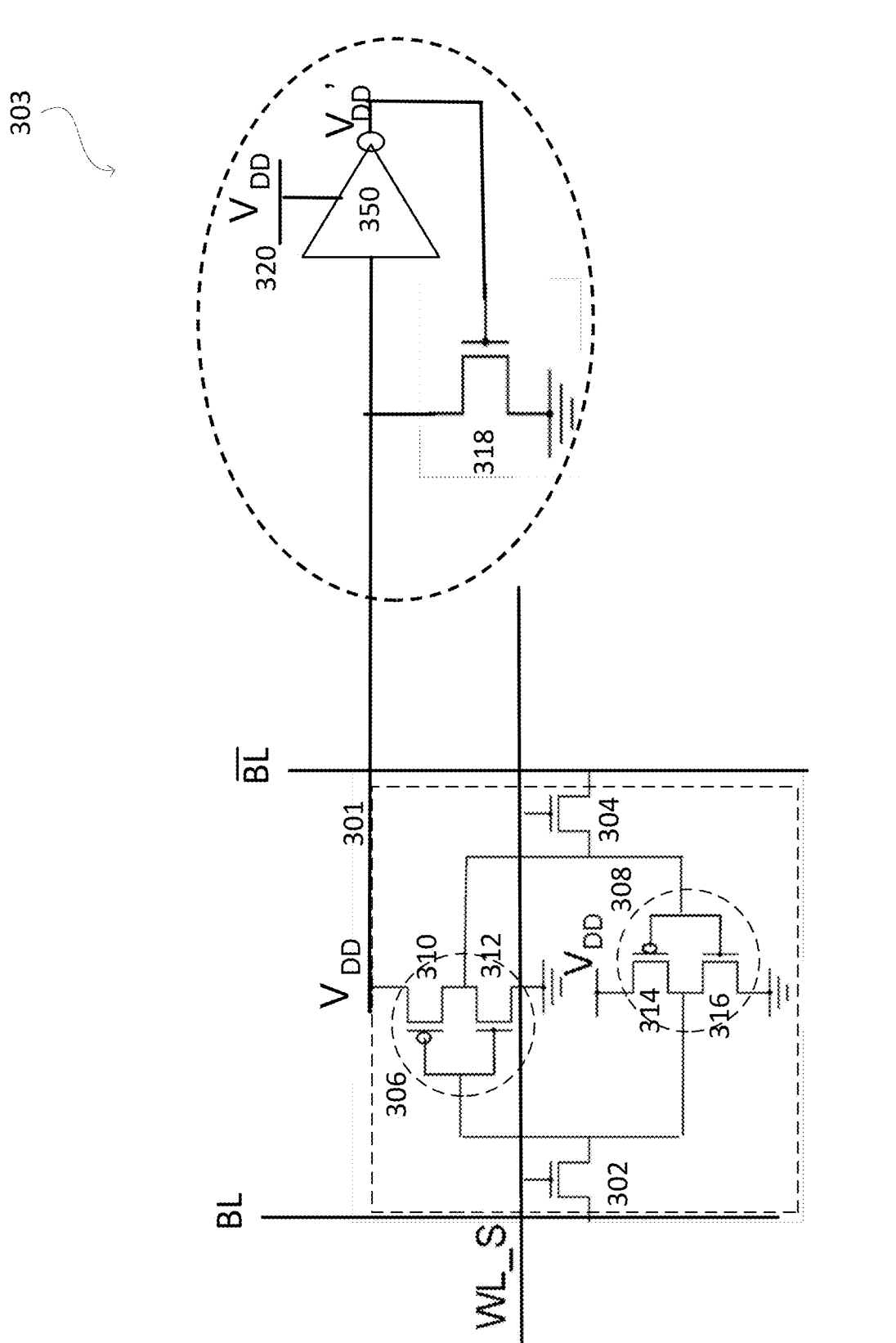
FIG. 3B illustrates an example SRAM cell design with a bleeder circuit connected to a first power supply via an inverter, according to one or more embodiments of the present disclosure.

FIG. 3B illustrates an example SRAM cell design with a bleeder circuit connected to a first power supply via an inverter, according to one or more embodiments of the present disclosure.

For example, the circuit 303 of FIG. 3B differs from the circuit 300 of FIG. 3A, in that in the circuit 303 of FIG. 3B, bleeder transistor 318 is connected to the first power supply ($V_{DD}$) at node 320 via an inverter 350. For example, in the embodiment of FIG. 3B, the drain electrode of the bleeder transistor 318 is connected to an input terminal of the inverter, the source electrode of the bleeder transistor 318 is connected to the ground, and the gate electrode of the bleeder transistor 318 is connected to the output of the inverter 350. As such, in the circuit 303 of FIG. 3B, the n-type bleeder transistor 318 is driven by an inverted supply signal, $V_{DD}'$ from the output of the inverter 350. For example, when the first power supply voltage is ON, $V_{DD}$ is high and $V_{DD}'$ is low and hence the n-type bleeder transistor 318 is off. However, when the first power supply is switched off, then $V_{DD}$ starts to drop and $V_{DD}'$ starts to rise and this turns ON bleeder transistor 318 resulting in faster discharge for node 320 connected to the first power supply.

As such, during regular operation of the circuit 303 when the first power supply is switched on, the amount of current leakage via the bleeder transistor 318 may be reduced (e.g., the current leakage may be in pA range) compared to the embodiment of FIG. 3A where the source and gate electrodes of the bleeder transistor 318 were directly connected to the first power supply at the node 320 and the bleeder transistor 318 was driven by $V_{DD}$.

Figure 4:
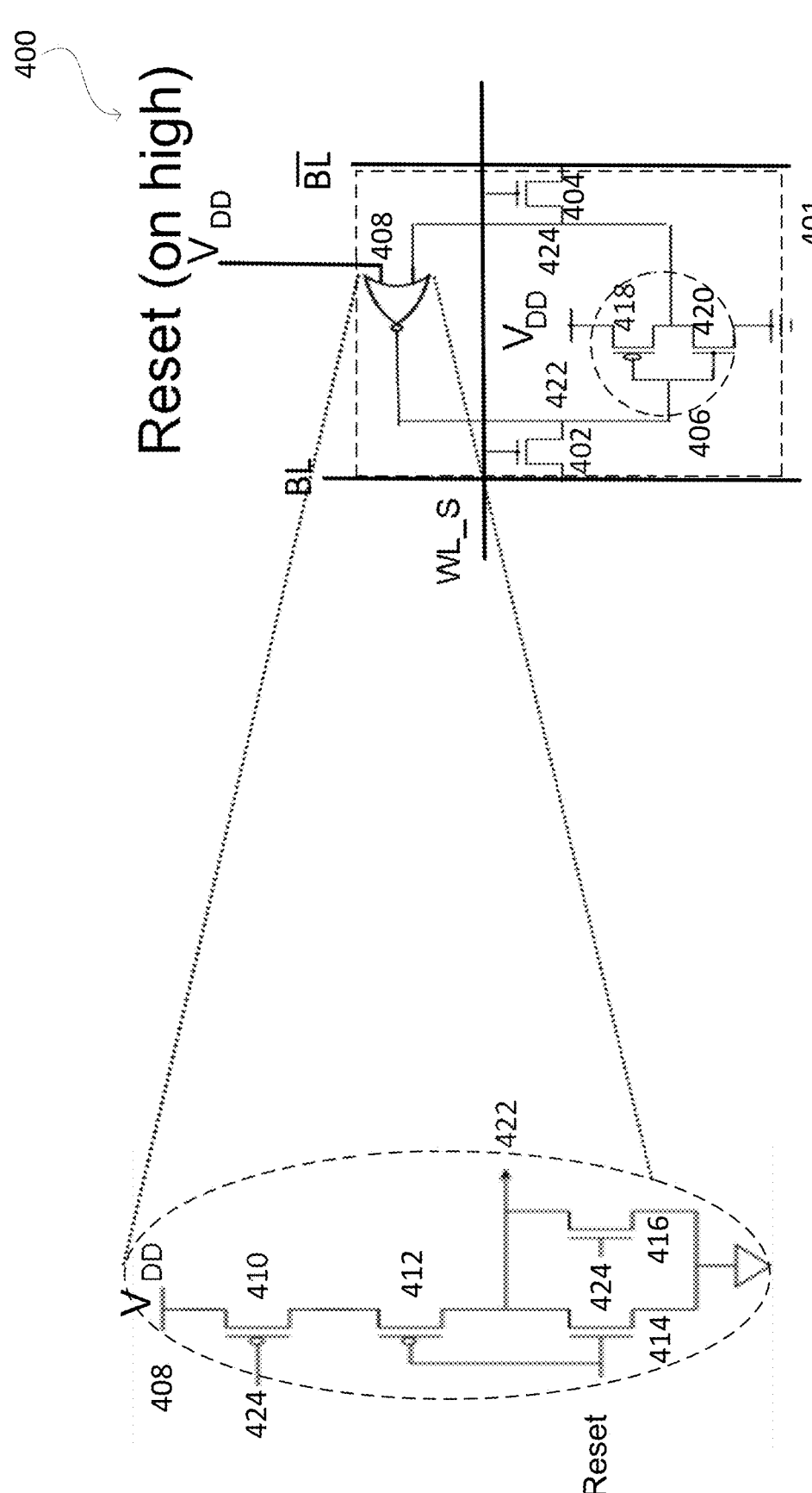
FIG. 4 illustrates an example SRAM cell design, according to one or more embodiments of the present disclosure.

FIG. 4 illustrates an example SRAM cell design, according to one or more embodiments of the present disclosure.

For example, the circuit 400 of FIG. 4 includes a SRAM cell 401. The SRAM cell 401 differs from the SRAM cell 101 in that in the SRAM cell 401 of FIG. 4, one of the two inverters is replaced with a NOR gate. For example, the SRAM cell 401 of FIG. 4 includes an inverter 406 cross coupled to a NOR gate 408. The inverter 406 includes a p-type transistor 418 and a n-type transistor 420. A first electrode of the transistor 418 is connected a first power supply (e.g., $V_{DD}$), and a second electrode of the transistor 418 is connected to a first electrode of the transistor 420. The second electrode of the transistor 420 is connected to the ground. The gate electrodes of the transistors 418 and 420 are connected to a node 422. The second electrode of the transistor 418 and the first electrode of the transistor 420 are connected to a node 424. The NOR gate 408 includes two p-type transistors 410 and 412 and two n-type transistors 414 and 416. A first electrode of the transistor 410 is connected to $V_{DD}$, and a second electrode of the transistor 410 is connected to a first electrode of the transistor 412. The second electrode of the transistor 412 is connected to a first electrode of the transistor 414 and a first electrode of the transistor 416. A second electrode of the transistor 414 and a second electrode of the transistor 416 are connected to the ground. The gate electrodes of the transistors 412 and 414 are connected to a reset signal line to receive a reset signal, which controls the transistors 412 and 414. The gate electrode of the transistors 410 and 416 are connected to the node 424. The second electrode of the transistor 412 and the first electrodes of the transistors 414 and 416 are connected to the node 422. As such, the output of the NOR gate 408 is connected to the node 422. The SRAM cell 401 of FIG. 4 further includes a first access transistor 402 connected between a bit line (BL) and the node 422 and a second access transistor 404 connected between the node 424 and a complement of the bit line ($\overline{BL}$). The gate electrodes of the transistors 402 and 404 are connected to a word line (WL_S). The transistors 402 and 404 are n-type transistors.

In one or more embodiments, the reset signal can be supplied to the SRAM cell 401 from the DRAM cell (e.g., a DRAM cell including the transistor 102 and the capacitor 104 of FIG. 1) connected to the SRAM cell 401. A global reset signal that is activated upon reboot can also be used. In one or more embodiments, the reset signal is used to globally reset all the SRAM cells or at least a plurality of SRAM cells in the SRAM array (e.g., SRAM array 260 of FIG. 2) upon reboot. The SRAM circuit 401 can be used to counter the cold boot attack, as the NOR gate 408 is reset upon reboot, hence acting as a bleeder (e.g., the bleeder transistor 124) to reset the SRAM cell 401.

For example, when $V_{DD}$ is switched back ON post shutdown or switch off, the SRAM cell 401 in an SRAM array (e.g., SRAM array 260 of FIG. 2) can be reset upon reboot hence benefitting from the added PMOS transistors 410 and 412 in the NOR gate 408 to reset the SRAM cell 401. This may also help prevent against different attacks including cold-boot attacks. The global reset of the SRAM cells of an array may also be useful in specific applications that require clearing or resetting all of the stored values in a memory to a same value (all zeroes or all ones) such as in some machine learning (ML) applications that perform padding (e.g., zero padding) of the data (e.g., some transformer models that make use of masked data). The reset signal can also be supplied to the SRAM cell 401 from an OR gate output whose inputs are fed from a global reset and the DRAM cell input (e.g., a DRAM cell including the transistor 102 and the capacitor 104 of FIG. 1).

The SRAM cell 401 of FIG. 4 can be used in an SRAM array (e.g., the SRAM array 260 of FIG. 2) to prevent or mitigate a power analysis attack where the write power pattern is used to detect what has been stored in the SRAM array. Because, when the SRAM cell 401 of FIG. 4 is used in an SRAM array (e.g., the SRAM array 260), a reset can be done at the block level (e.g., each SRAM cell having the circuit of SRAM cell 401 in an SRAM array is reset) prior to a write operation. As such, attackers cannot detect from power analysis what has been written before in each SRAM cell during reset and the consequent write, because reset is done globally, and the consequent write handles data different from the secret key/data stored in the SRAM cell before the reset.

Because the SRAM circuit 401 of FIG. 4 is reset at boot, the SRAM circuit 401 can be used in an SRAM array to prevent imprinting where repeated identical writes may result in the SRAM cell booting to a critical old status, for example a key. The SRAM cell 401 of FIG. 4 can be used in an SRAM array for quick 'zero' or 'one' data padding by using the block or global reset in the ML applications. For example, an SRAM array having all or some of the SRAM cells having the circuit of the SRAM cell 401, all or some of the SRAM cells may be reset using the reset signal applied to the SRAM cell for data padding in a ML application.

In one or more embodiments, the embodiments of FIGS. 3A and 3B having the local $V_{DD}$ bleeder (e.g., the bleeder transistor 318) can be combined with the embodiment of FIG. 1, where a bleeder transistor (e.g., the bleeder transistor 124) is connected to a storage node (e.g., the node N1) of a SRAM cell (e.g., the SRAM cell 101) to further protect a SRAM array from cold boot attack. For example, a DRAM cell, and PMOS transistors (102, 104 and 106) may be connected to the bleeder transistors (e.g., the bleeder transistor 124 connected for example at node N1) of one or more SRAM cells) of the SRAM array to discharge the connected SRAM cells quickly (e.g., a subset of the SRAM cells, such as 10% of the cells of the SRAM array), and the local $V_{DD}$ bleeder (e.g., the bleeder transistor 318 with the inverter 350) may be connected to the power supply configured to supply $V_{DD}$ to a column of the SRAM array, row or to the entire SRAM array (e.g., the SRAM array 260 of FIG. 2) to protect other SRAM cells in the SRAM array that do not include the bleeder transistor (e.g., the bleeder transistor 124) that discharges those SRAM cells in the event of power loss. Therefore, the SRAM cells in the SRAM array will be protected from a cold boot attack. The local $V_{DD}$ bleeder (e.g., the bleeder transistor 318 with the inverter 350) also reinforces the protection for the SRAM cells that include the bleeder transistor (e.g., the bleeder transistor 124).

In one or more embodiments, the embodiments of FIGS. 3A and 3B having the local $V_{DD}$ bleeder (e.g., the bleeder transistor 318) can be combined with the embodiment of FIG. 4, where in a SRAM cell, one of the two inverters is replaced with a NOR gate to further prevent a SRAM array from a cold boot attack. For example, in one or more SRAM cells of the SRAM array, one of the two inverters may be replaced with a NOR gate (e.g., as shown in SRAM cell 401 of FIG. 4) to discharge the SRAM cells having the NOR gate rather quickly and a local $V_{DD}$ bleeder (e.g., the bleeder transistor 318 with the inverter 350) may be connected to the power supply configured to supply $V_{DD}$ to a column of the SRAM array or to the entire SRAM array (e.g., the SRAM array 260 of FIG. 2) to protect other SRAM cells in the SRAM array that do not include the NOR gate, in the event of power loss and also reinforce the protection of the SRAM cells with the inverter replaced by a NOR (e.g., as shown in SRAM cell 401 of FIG. 4). Therefore, the SRAM cells in the SRAM array will be protected from a cold boot attack, and the power or imprint attack. The SRAM cells in the SRAM array may also be reset or data padded globally or across an entire block of SRAM cells that are independently controllable through those NOR gates.

Figure 5A:
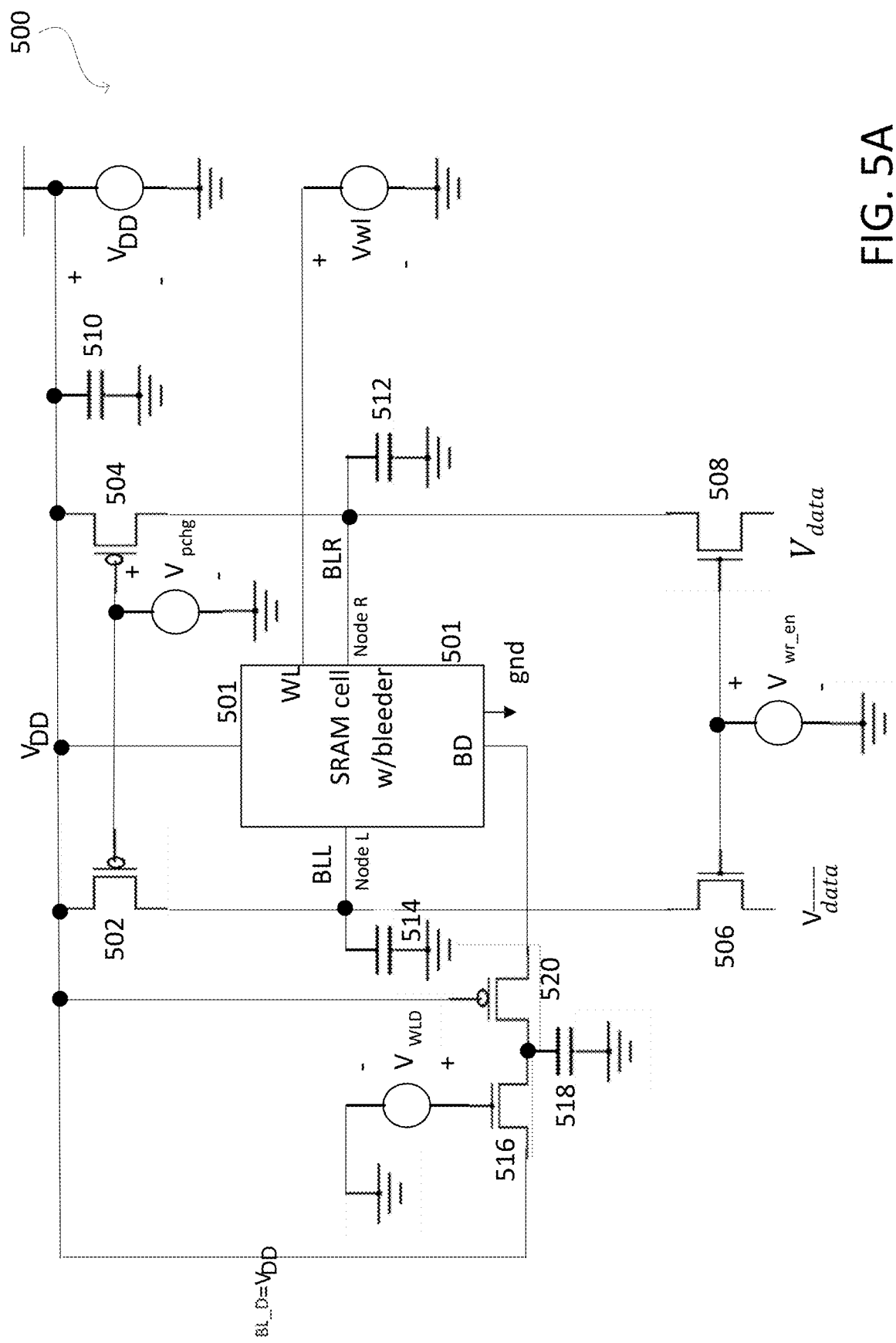
FIG. 5A illustrates a circuit having a SRAM cell with a bleeder transistor, according to one or more embodiments of the present disclosure.
Figure 5B:
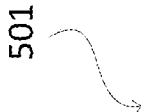
FIG. 5B illustrates in detail the circuit of the SRAM cell with the bleeder transistor of FIG. 5A.
Figure 5B:
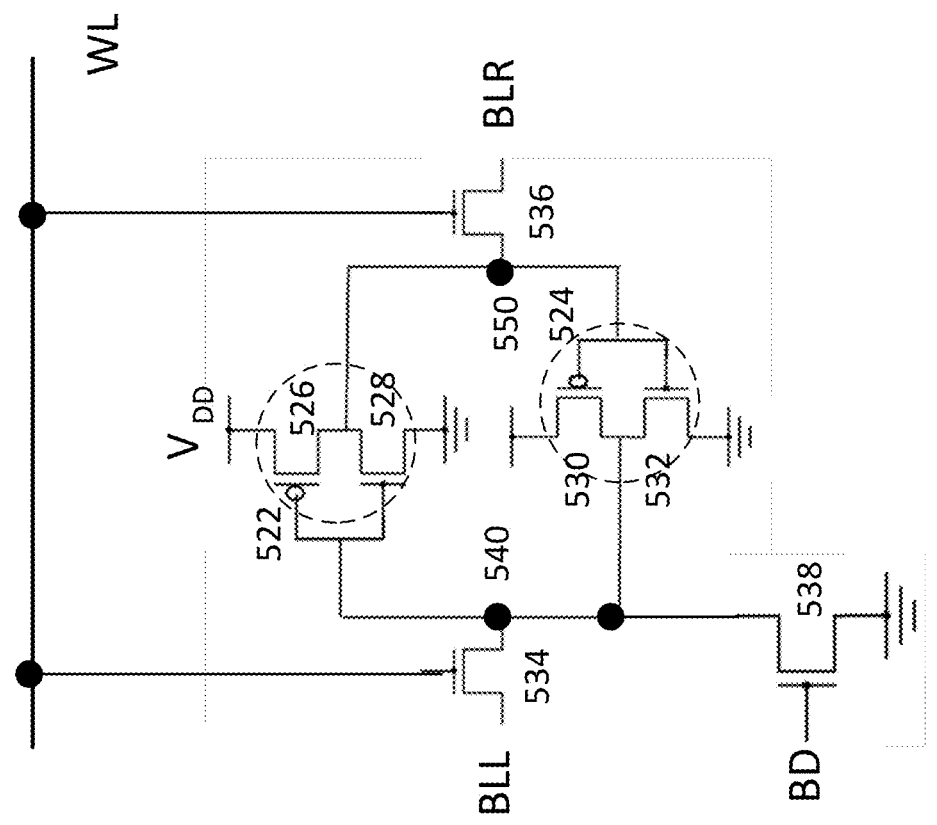
Figure 5C:
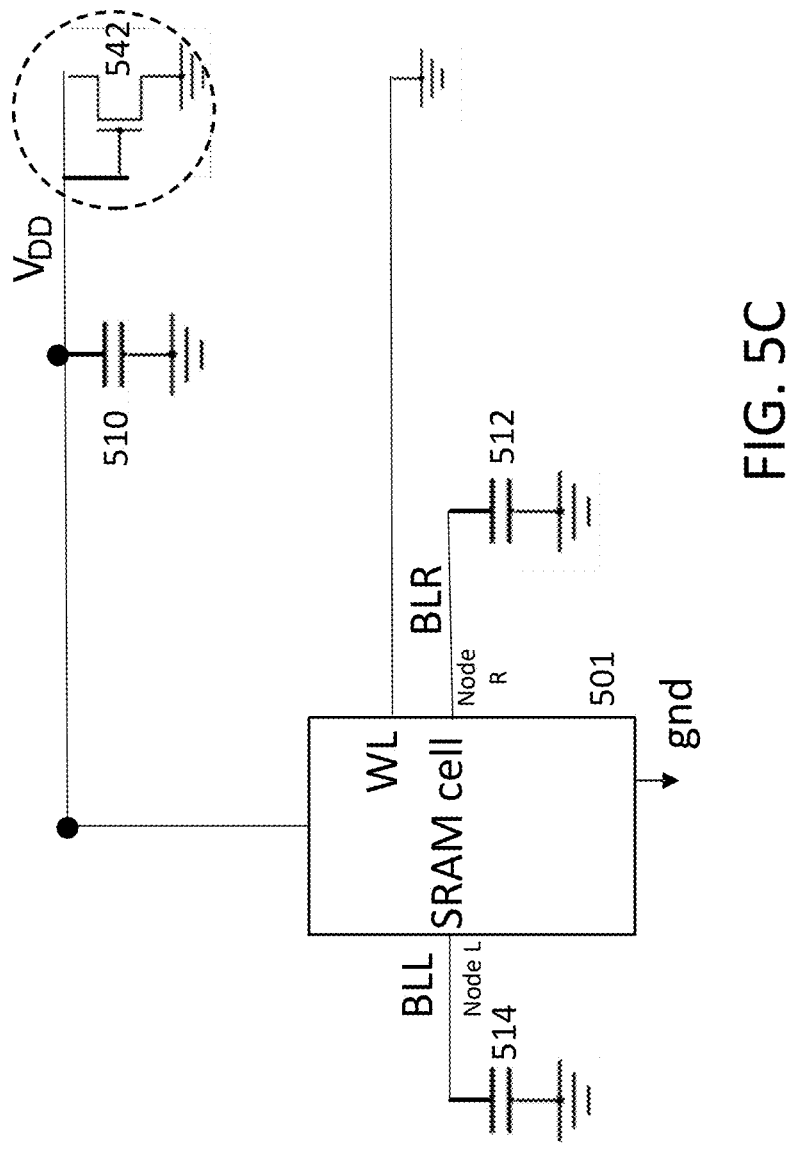
FIG. 5C illustrates a circuit having a SRAM cell where a bleeder is connected to the power supply.
Figure 5D:
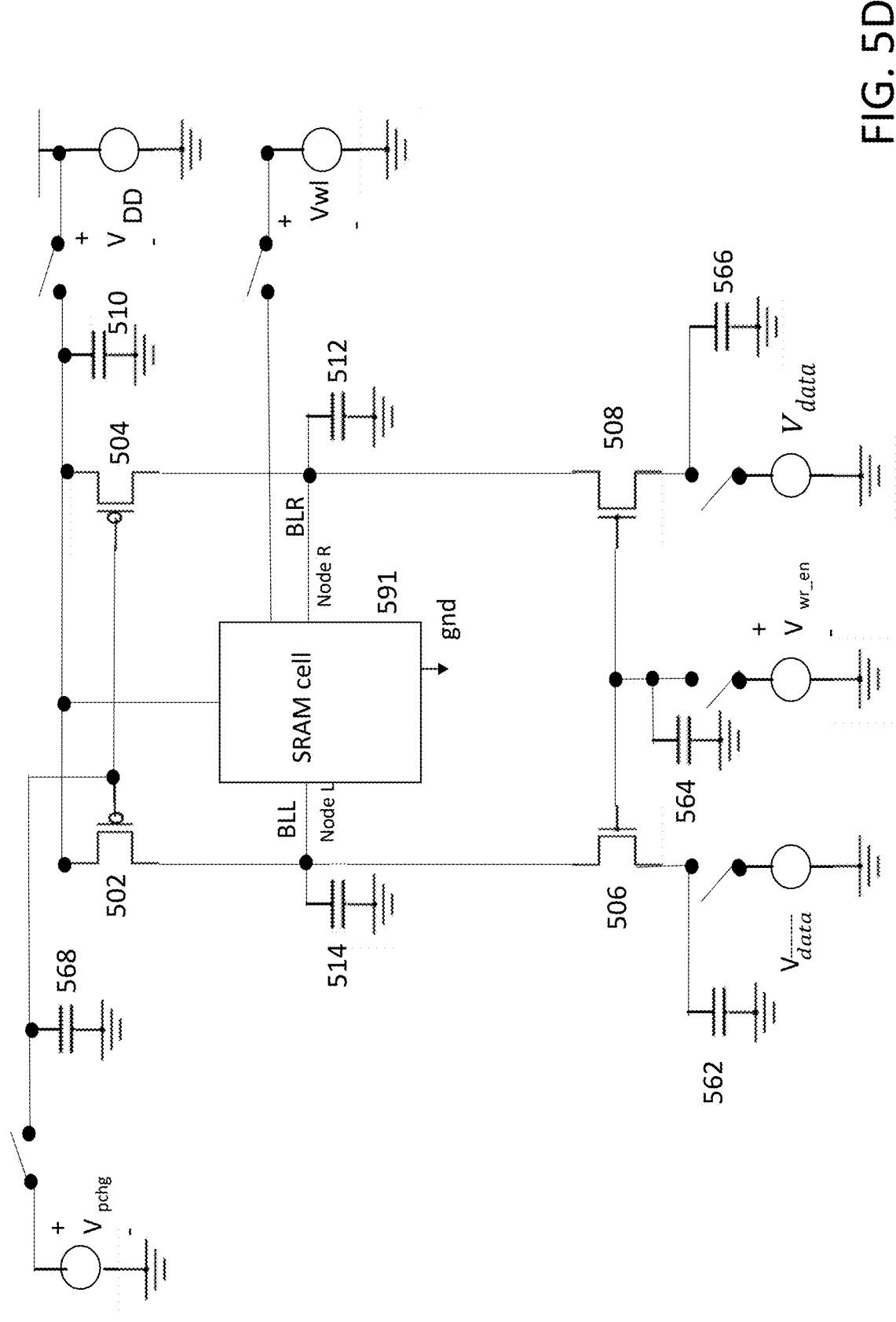
FIG. 5D illustrates a comparative circuit where the SRAM cell does not include a bleeder transistor and when all the power supplies are switched off.

FIG. 5A illustrates a circuit having a SRAM cell with a bleeder transistor, according to one or more embodiments of the present disclosure. FIG. 5B illustrates in detail the circuit of the SRAM cell with the bleeder transistor of FIG. 5A. FIG. 5C illustrates a circuit having the SRAM cell, where a $V_{DD}$ bleeder is connected to the power supply according to one or more embodiments of the present disclosure. FIG. 5D illustrates a circuit that represents the circuit of FIG. 5A when the supply voltage $V_{DD}$ and other power supplies of the circuit of FIG. 5A are switched off.

The circuit 500 of FIG. 5A includes a SRAM cell with a bleeder transistor 501, which may be similar to the SRAM cell 101 coupled to the bleeder transistor 124 on FIG. 1. The circuit 500 of FIG. 5A also includes transistors 502, 504, 506, 508, 516 and 520. In the circuit 500 of FIG. 5A, transistors 502, 504, and 520 are p-type transistors and transistors 506, 508, and 516 are n-type transistors. The circuit 500 of FIG. 5A further includes capacitors 510, 512, 514, and 518, and voltage sources or power sources $V_{DD}$, $V_{data}$, $V_{wr\_en}$, $V_{wl}$, $V_{pchg}$, and $V_{WLD}$. The circuit 500 is configured to test the operation of the SRAM cell with a bleeder transistor 501. Transistors 502 and 504 control the voltage signals supplied to the bit lines (bit line left BLL (or BL of FIG. 1) and bit line right BLR (or $\overline{BL}$ of FIG. 1)) as supplied from voltage source $V_{DD}$, and transistors 502 and 504 control the voltage signals supplied to the bit lines (bit line left BLL and bit line right BLR) as supplied from voltage source $V_{data}$. Transistor 516 and capacitor 518 form a DRAM cell corresponding to that shown in FIG. 1 and transistor 520 corresponds to the transistor 106 shown in FIG. 1, where the transistor 520 feeds a bleeder signal to the bleeder transistor in the SRAM cell 501 through a bleeder signal pin BD (e.g., node N3 of FIG. 1).

As illustrated in FIG. 5B, the SRAM cell 501 includes six transistors 526, 528, 530, 532, 534, and 536 that represents a SRAM cell, and a bleeder transistor 538 connected thereto. The bleeder transistor 538 is connected to a node 540 of the SRAM cell 501 as has a gate electrode connected to bleeder signal pin BD. The SRAM cell 501 includes two cross coupled inverters 522 and 524. The inverter 522 includes a p-type transistor 526 and a n-type transistor 528. A first electrode of the transistor 526 is connected to $V_{DD}$, and a second electrode of the transistor 526 is connected to a first electrode of the transistor 528. The second electrode of the transistor 528 is connected to the ground. The gate electrodes of the transistors 526 and 528 are connected to the node 540. The second electrode of the transistor 526 and the first electrode of the transistor 528 are connected to a node 550. The inverter 524 includes a p-type transistor 530 and a n-type transistor 532. A first electrode of the transistor 530 is connected to $V_{DD}$, and a second electrode of the transistor 530 is connected to a first electrode of the transistor 532. The second electrode of the transistor 532 is connected to the ground. The gate electrodes of the transistors 530 and 532 are connected to the node 550. The second electrode of the transistor 530 and the first electrode of the transistor 532 are connected to the node 540. The SRAM cell 501 further includes a first access transistor 534 connected between a node BLL configured to receive a data voltage $V_{data}$ via the transistor 506 and the node 540 and a second access transistor 536 connected between the node 550 and a node BLR configured to receive a data voltage $V_{data}$ via the transistor 508. The gate electrodes of the transistors 534 and 536 are connected to a word line WL. The transistors 534 and 536 are n-type transistors. The nodes BLL and BLR are coupled to the ground via capacitors 514 and 512, respectively, to filter and/or reduce noise in the circuit 500.

In the SRAM cell 501, the two access transistors 534 and 536 are used to access the stored data in the SRAM cell 501. The transistors 534 and 536 are turned ON/OFF by the word line WL (e.g., WL_S of FIG. 1). In one or more embodiments, the word line WL is connected to the output of a row decoder circuit. In FIG. 5A, the word line WL is connected to a voltage or power source $V_{wl}$, and when $V_{wl}$ is high, the transistors 534 and 536 are turned on and connects the SRAM cell 501 to the nodes BLL and BLR, which are configured to receive a data voltage $V_{data}$, to allow both read and write operations in the SRAM cell 501. Read-write operations in the SRAM cell 501 is carried out by the help of access transistors 534 and 536.

The bleeder transistor 538 is connected at the node 540 of the SRAM cell 501 to quickly discharge the data stored in the SRAM cell 501 when the power supply is switched off (e.g., when $V_{DD}$=0). The bleeder transistor 538 is connected between the node 540 of the SRAM cell 501 and the ground. The gate electrode of the bleeder transistor 538 is connected to a node BD, which is pre-discharged. The bleeder transistor 538 only turns on in a power loss event (e.g., $V_{DD}$=0) to discharge node 540 of the SRAM cell 501 to the ground so that the data stored in the SRAM cell 501 cannot be recovered in a cold boot attack. The bleeder transistor 538 is a n-type transistor. In one or more embodiments, the bleeder transistor 538 may also be connected at the node 550 to quickly discharge the data stored in the SRAM cell 501 when the power supply is switched off (e.g., when $V_{DD}$=0) and reset the SRAM cell 501.

Referring again to FIG. 5A, the transistor 516, which along with the capacitor 518 represents a DRAM cell, is connected between $V_{DD}$, and the capacitor 518 and the transistor 520. For example, a first electrode of the transistor 516 may be connected to $V_{DD}$ and a second electrode of the transistor 516 may be connected to a first electrode of the capacitor 518 and a first electrode of the transistor 520. The second electrode of the capacitor 518 is connected to the ground and the second electrode of the transistor 520 is connected to the gate electrode of the bleeder transistor 538 (e.g., see FIG. 5B) via the node or pin BD, which is pre-discharged. The gate electrode of the transistor 516 is connected to a voltage source $V_{WLD}$ and the gate electrode of transistor 520 is connected to $V_{DD}$. When the voltage source $V_{WLD}$ supplies a high level voltage, the transistor 516 is turned on and connects the voltage source $V_{DD}$ with the capacitor 518, which stores the charge corresponding to $V_{DD}$.

Since transistor 520 is a p-type transistor, it is power gated by $V_{DD}$. For example, the transistor 520 is turned on when $V_{DD}$ starts to drop in a power loss event. When transistor 520 is turned on, it connects the pre-charged capacitor 518 to the gate electrode of the bleeder transistor 538 via the node BD and the charge stored in the capacitor 518 is transferred to the gate electrode of the bleeder transistor 538 via the node BD to turn on the bleeder transistor 538. Once the bleeder transistor 538 turns on, the node 540 of the SRAM is discharged to the ground. As such, the data stored in the SRAM cell 501 is quickly discharged, which prevents data recovery in a cold boot attack. This results in flipping SRAM cell content (reset to all zeros at node 540 for example). As such, a bleeder transistor 538 may be used to reset critical memory blocks where keys are stored or may be used to reset a part of the memory (e.g., at least 10% of the memory blocks) to prevent full data recovery.

In the circuit 500 of FIG. 5A, transistor 502 is connected between $V_{DD}$ and the node BLL and the transistor 504 is connected between $V_{DD}$ and the node BLR. The gate electrodes of the transistors 502 and 504 are coupled together and connected to a voltage or power source $V_{pchg}$. The transistor 506 is connected between Vdata and the node BLL and the transistor 508 is connected between $V_{data}$ and the node BLR. The gate electrodes of the transistors 506 and 508 are coupled together and connected to a voltage or power source $V_{wr\_en}$. In the circuit 500 of FIG. 5A, the capacitor 510 is connected between the voltage or power source $V_{DD}$ and the ground.

FIG. 5C illustrates a circuit having a SRAM cell where a bleeder is connected to the power supply. For example, FIG. 5C illustrates an embodiment where a bleeder transistor 542 is connected to the power or voltage source $V_{DD}$. The circuit of FIG. 5C illustrates the SRAM cell 501 without the bleeder transistor 538 of the circuit 500 when the supply voltage $V_{DD}$ and other power supplies of the circuit 500 of FIG. 5A are switched off and a bleeder transistor 542 is connected to the power or voltage source $V_{DD}$. The circuit of FIG. 5C only illustrates the SRAM cell 501 without the bleeder transistor 538 and the capacitors 510, 512, and 514 from the circuit 500 of FIG. 5A, for ease of description. The bleeder transistor 542 is a n-type transistor whose gate and drain electrodes are connected to $V_{DD}$. When $V_{DD}$ is switched off, $V_{DD}$ starts to go down, while the bleeder transistor 542 stays ON until $V_{DD}$ drops below a threshold gate voltage of the bleeder transistor 542, which helps the voltage or power supply $V_{DD}$ to drop fast. For example, when $V_{DD}$ is switched off, until $V_{DD}$ drops below the threshold gate voltage of the bleeder transistor 542, voltage (e.g., electric potential) at the voltage or power supply $V_{DD}$, may be quickly discharged to the ground via the bleeder transistor 542. In one or more embodiments, a threshold gate voltage of the bleeder transistor 542 may be between 0.05V and 0.1V.

FIG. 5D illustrates a comparative circuit where the SRAM cell does not include a bleeder transistor and when all the power supplies are switched off.

In FIG. 5D some components, such as transistors 516, 520, and the capacitor 518 are not shown because when all the power supplies of the circuit 500 of FIG. 5A is switched off, the transistors 516, 520, and the capacitor 518 will not be connected to the SRAM cell (without a bleeder transistor) 591. In FIG. 5D, the components of the circuit 500 that are connected to the SRAM cell 591 when all the power supplies are switched off are shown.

As shown in FIG. 5D, when all the voltage or power supplies in the circuit 500 of FIG. 5A are switched off, the drain electrodes of the transistors 506 and 508, which were connected to the data voltage Vdata when the power supplies of the circuit 500 were on, are now connected to ground via capacitors 562 and 566, respectively. The gate electrodes of the transistors 506 and 508, which were connected to $V_{wr\_en}$ when the power supplies of the circuit 500 were on, are now connected to the ground via a capacitor 564. When all the voltage or power supplies in the circuit 500 of FIG. 5A are switched off, the gate electrodes of the transistors 502 and 504 are connected to ground via a capacitor 568. Also, the source electrodes of the transistors 502 and 504, which were connected to the $V_{DD}$ when the power supplies of the circuit 500 were on, are now connected to the ground via the capacitor 510.

The capacitors 510, 512, 514, 562, 564, 566, 568, may act as noise filters to reduce noise which may affect the performance of the circuit 500. The capacitors 510, 512, 514, 562, 564, 566, 568, store the charge that was prior to switch off and will slowly leak in cold operating regimes.

Figures 6A, 6B:
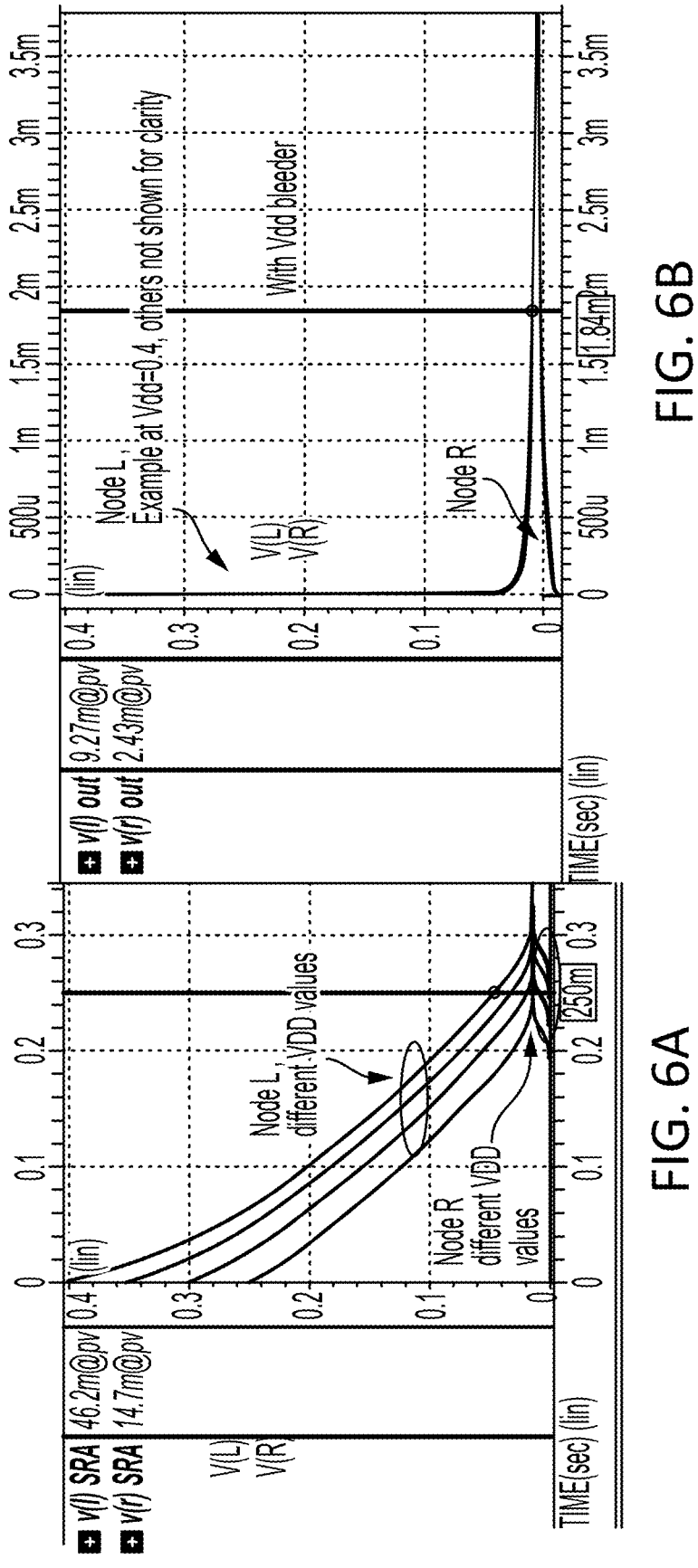
FIG. 6A illustrates a graph representing a voltage leakage as a function of time in a comparative circuit where there is no bleeder transistor.
FIG. 6B illustrates a graph representing a voltage leakage as a function of time in the circuit of FIG. 5C.

FIG. 6A illustrates a graph representing a voltage leakage as a function of time in a comparative circuit with no bleeder transistor where $V_{DD}$ is left floating when power is switched off (e.g., as shown in FIG. 5D). FIG. 6B illustrates a graph representing a voltage leakage as a function of time in the circuit (e.g., circuit of FIG. 5C) when power is switched off, where a local $V_{DD}$ bleeder transistor is connected to the source $V_{DD}$, as shown in the circuit of FIG. 5C.

As shown from FIG. 6A, without a bleeder transistor in the SRAM cell 591, it may take several 100 milliseconds (e.g., 250 millisecond) for the $V_{DD}$ to fully discharge and for the data remanence in a SRAM cell to disappear from the SRAM cell. For example, FIG. 6A illustrates graphs representing voltages (e.g., $V_{DD}$ values) at node L and node R of the SRAM cell 591 of FIG. 5D. As shown in FIG. 6A, node L and node R may take several 100 milliseconds to fully discharge in the absence of a bleeder transistor. However, as shown in FIG. 6B when a local $V_{DD}$ bleeder transistor is connected to the source $V_{DD}$ (in addition to the SRAM cell having a bleeder transistor, as shown in the circuit of FIG. 5C), the local $V_{DD}$ bleeder transistor can expedite the discharging time of the SRAM cell from several 100 milliseconds to 3-4 milliseconds. For example, as shown in FIG. 6B, node L and node R of the SRAM cell 501 having a bleeder transistor (as shown in the circuit of FIG. 5C) may discharge in 3-4 milliseconds. As such, the local $V_{DD}$ bleeder transistor can significantly expedite the discharging time of the SRAM cell.

Figure 7A:
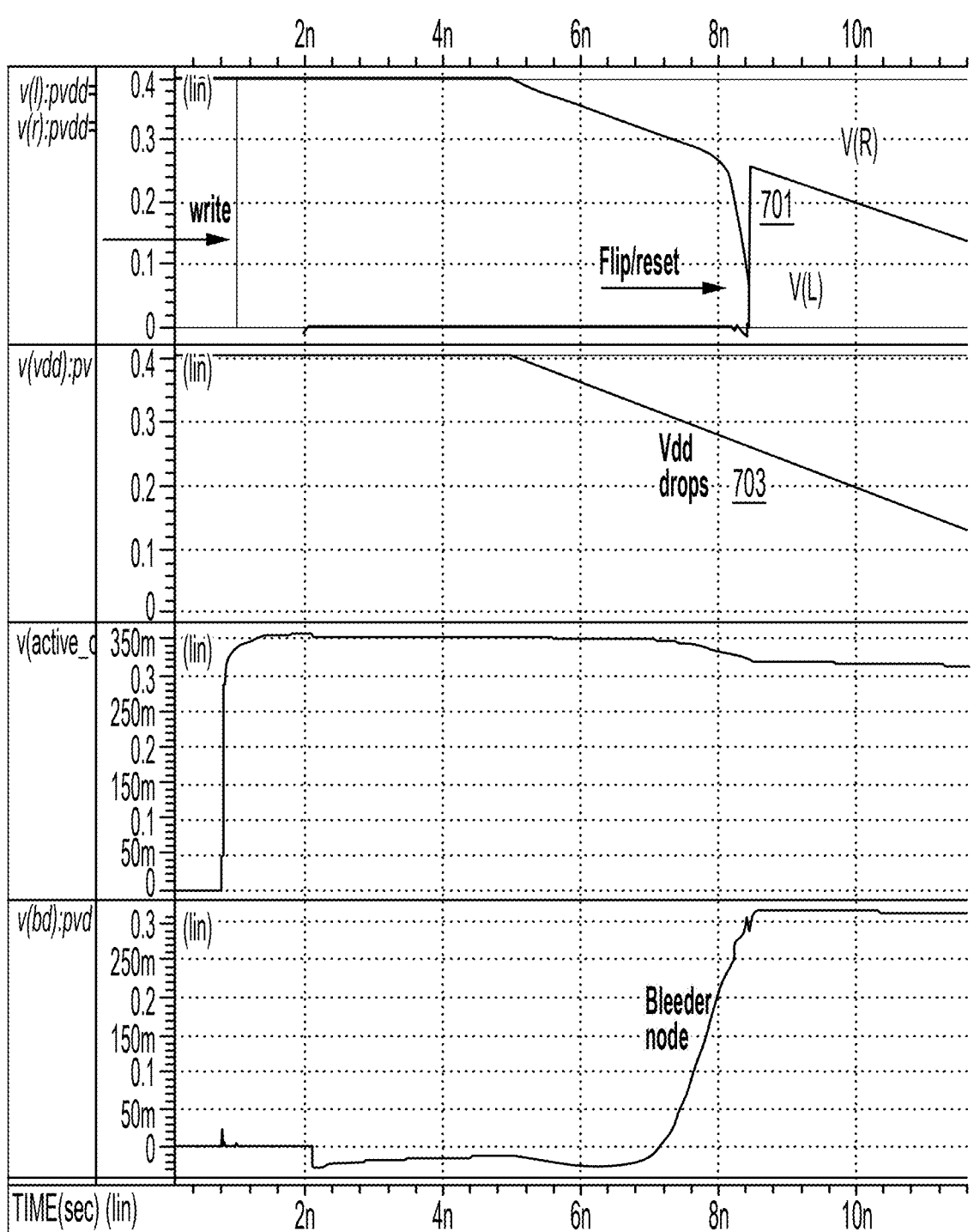
FIGS. 7A and 7B illustrate a voltage leakage as a function of time in a SRAM cell with the bleeder transistor in two different semiconductor process technology nodes.
Figure 7B:
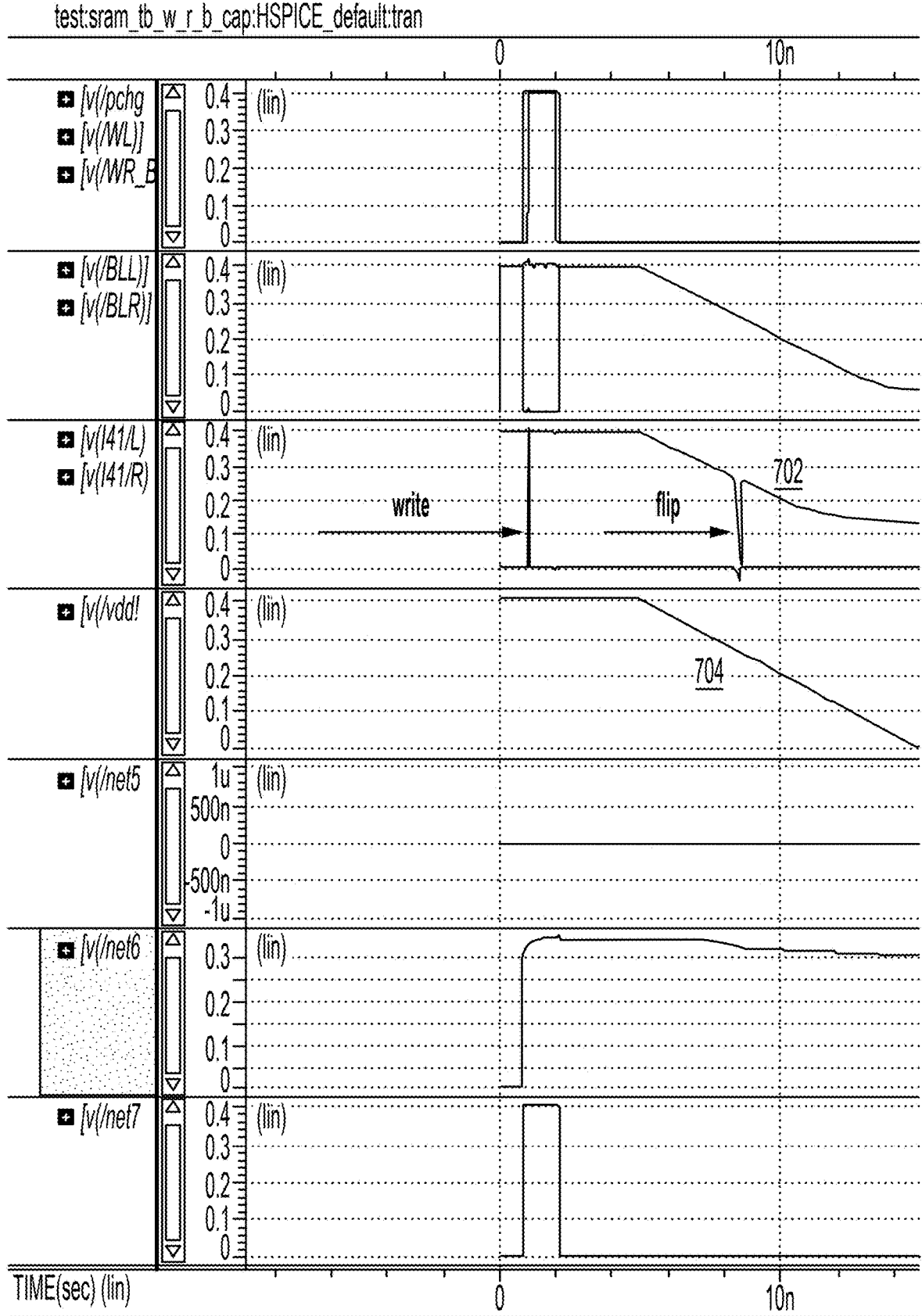
Figure 7C:
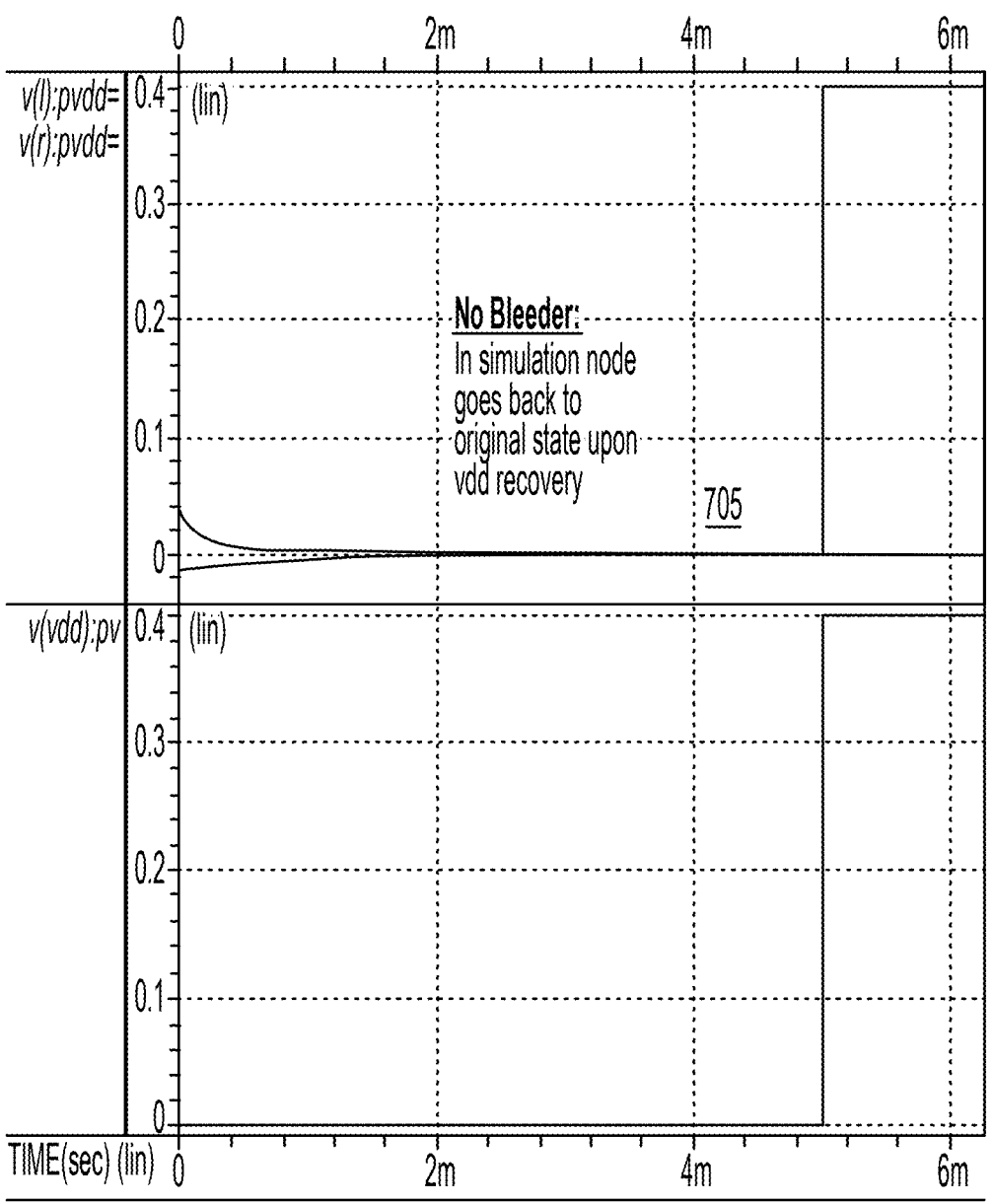
FIG. 7C illustrates a case in the same semiconductor process technology node of FIG. 7A but where the SRAM cell does not include a bleeder transistor.

FIGS. 7A and 7B illustrate a voltage leakage as a function of time in the SRAM cell with the bleeder transistor 501 in two different semiconductor process technology nodes (e.g., node L and node R, as shown in FIG. 5A), when $V_{DD}$ is pulled down to ground. As shown in the graphs of FIG. 7A and FIG. 7B (e.g., 701, 702), the SRAM cell content flips within few nanoseconds of $V_{DD}$ dropping (e.g., 703, 704). In contrast, FIG. 7C illustrates a case in the same semiconductor process technology node of FIG. 7A but where the SRAM cell does not include a bleeder transistor (e.g., node L and node R, as shown in FIG. 5D) where the voltage at the node of SRAM cell is maintained for a few milliseconds and restore to their original states upon $V_{DD}$ recovery (e.g., 705).

Figure 8A:
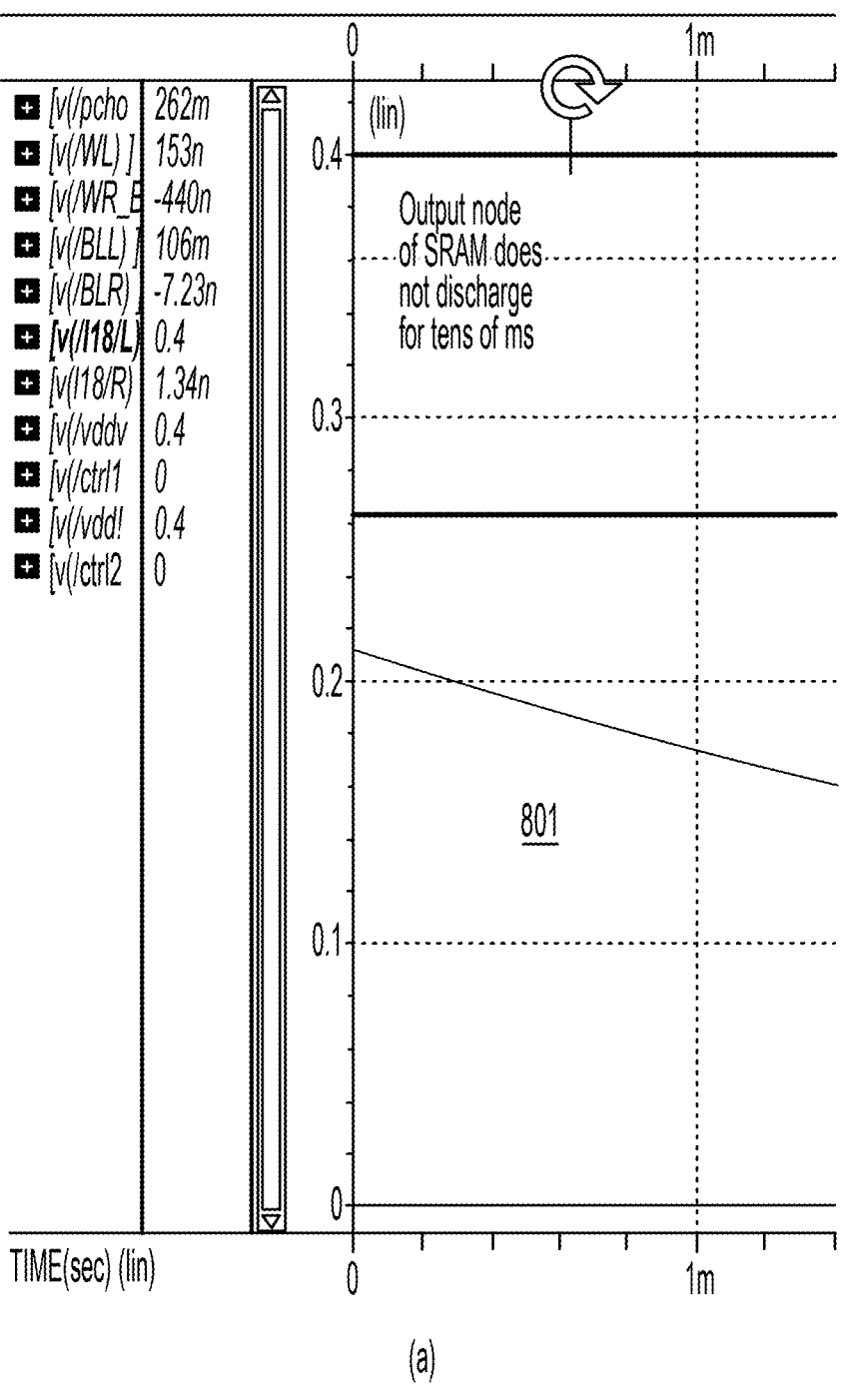
FIGS. 8A-8C illustrate graphs representing a voltage leakage as a function of time in the circuit of FIG. 5D when all the power supplies are switched off.
Figure 8B:
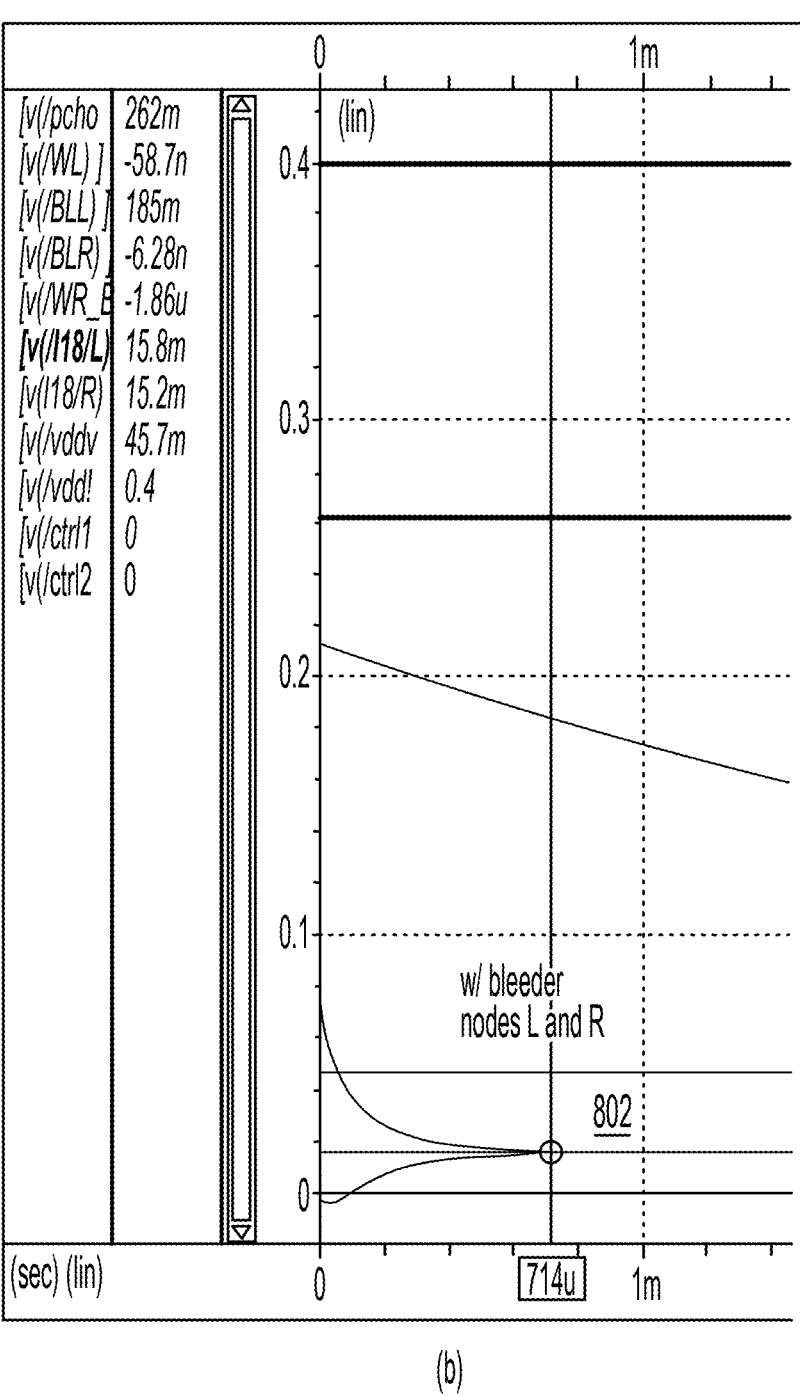
Figure 8C:
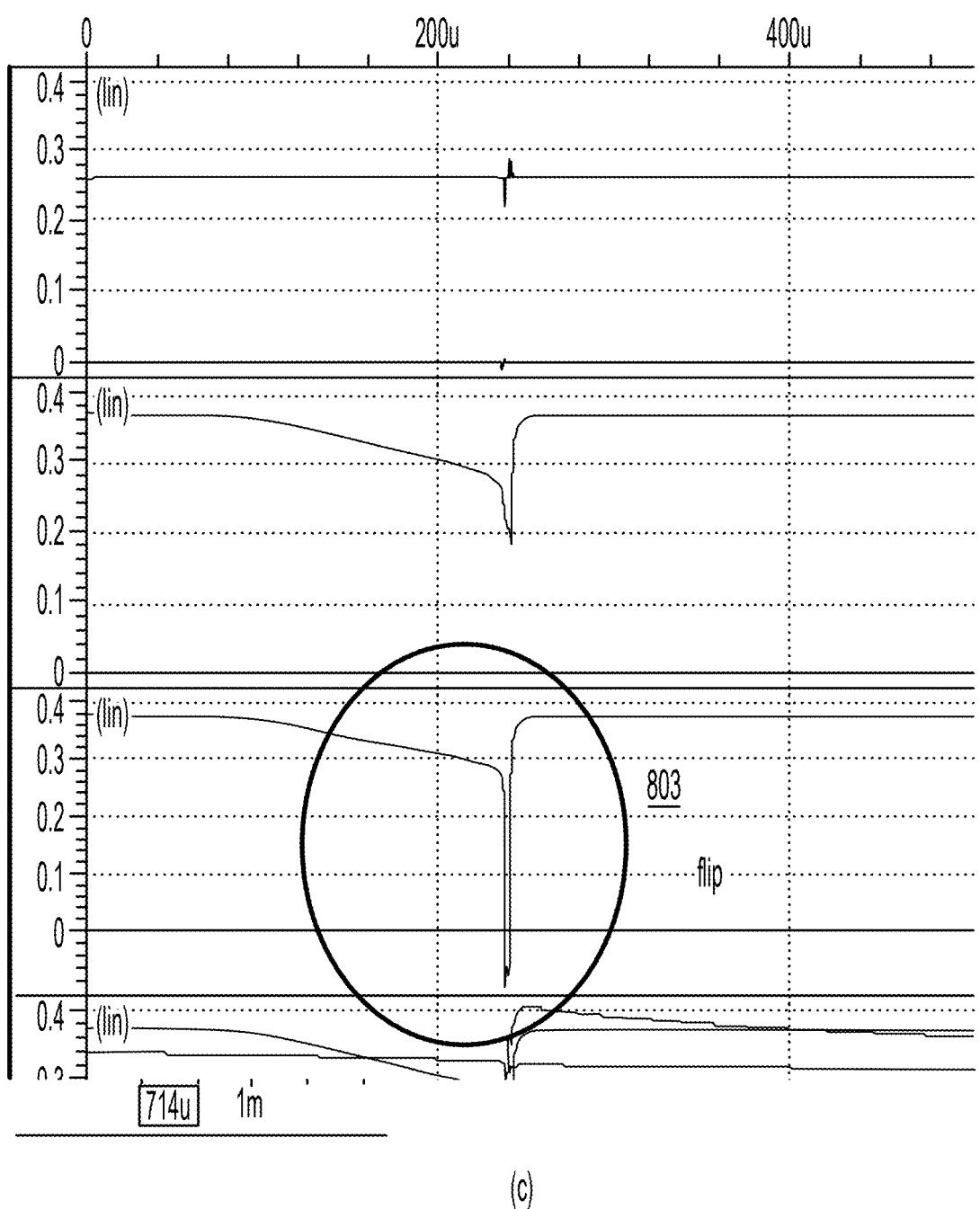

FIG. 8A illustrates a graph representing a voltage leakage as a function of time when $V_{DD}$ and other power supplies are switched off, as shown in the circuit of FIG. 5D. FIG. 8B also shows the leakage when a $V_{DD}$ bleeder is added, and FIG. 8C shows the leakage when a SRAM built-in bleeder is added.

Without a bleeder transistor (e.g., FIG. 5D), the signal (e.g., the signal at the output node (e.g., node R) of the SRAM cell 591) is held for more than few hundred milliseconds, as shown in FIG. 8A (801). In the case of the $V_{DD}$ bleeder (for example, FIG. 5C), within 700 us the $V_{DD}$ bleeder results in nodes L and R dropping to the same value, as shown in FIG. 8B (802). In the case of a SRAM bleeder (e.g., FIG. 5B), within 200 us, the SRAM bleeder results in the cell content flipping as the node (e.g., 540) connected to the bleeder (initially high) gets pulled down, as shown in FIG. 8C (803).

Figure 9:
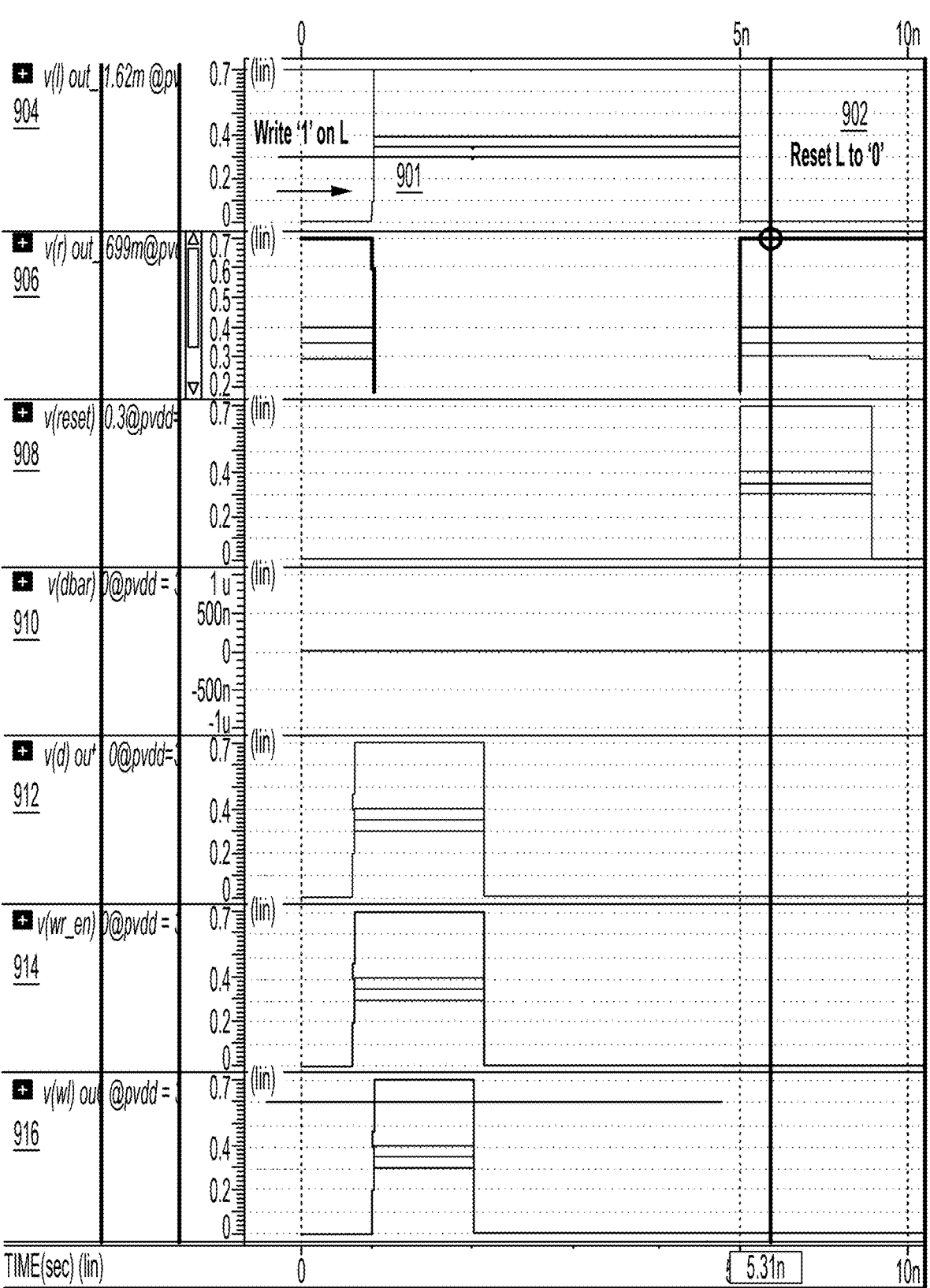
FIG. 9 illustrates graphs representing a voltage as a function of time in the circuit of FIG. 5A, when one of the two inverters of the SRAM cell is replaced with a NOR gate as is the case for FIG. 4.

FIG. 9 illustrates graphs representing a voltage as a function of time in the circuit 500, when one of the two inverters of the SRAM cell 501 is replaced with a NOR gate. FIG. 9 (e.g., 901) shows a write '1' at node L followed by a reset of the same node to '0' (e.g., 902). In the graphs of FIG. 9, this is demonstrated at different supply voltage levels (e.g., 904, 906, 908, 910, 912, 914, 916).

What is claimed is:

1. A circuit comprising:
    a memory cell connected to a first power supply configured to supply a first power supply voltage;
    a first bleeder transistor coupled between a first node of the memory cell and ground; and
    a second circuit coupled to a gate electrode of the first bleeder transistor and configured to supply a bleeder signal to control the first bleeder transistor in response to a drop in the first power supply voltage,
    wherein the first bleeder transistor is configured to discharge the memory cell in response to receiving the bleeder signal,
    wherein the second circuit comprises a first transistor and a capacitor,
    wherein a first electrode of the first transistor is connected to a first data line and a second electrode of the first transistor is connected to a first electrode of the capacitor, wherein a gate electrode of the first transistor is connected to a first word line, wherein a second electrode of the capacitor is connected to the ground, and wherein the gate electrode of the first bleeder transistor is connected to the second circuit via a second transistor.

2. The circuit of claim 1, wherein:

a first electrode of the second transistor is connected to the second electrode of the first transistor and the first electrode of the capacitor;

the second electrode of the second transistor is connected to the gate electrode of the first bleeder transistor via a second node;

the gate electrode of the second transistor is connected to the first power supply voltage; and when the first power supply voltage is at a low level, the second circuit is configured to supply the bleeder signal to the gate electrode of the first transistor via the second transistor to turn on the first bleeder transistor.

3. The circuit of claim 1, wherein the first transistor is an n-type transistor and the second transistor is a p-type transistor.

4. The circuit of claim 1, wherein the second circuit is connected to one or more memory cells in a same row of a memory array comprising a plurality of memory cells, the one or more memory cells in the same row of the memory array being connected to a same word line, wherein the second circuit is connected to a portion of the plurality of memory cells of the memory array that are connected to the same word line, and wherein the portion of the plurality of memory cells of the memory array comprise a corresponding bleeder transistor to discharge a corresponding memory cell in response to the drop in the first power supply voltage.

5. The circuit of claim 1, wherein the first bleeder transistor is further coupled between a third node of the memory cell and the ground.

6. The circuit of claim 1, further comprising a third transistor coupled between the ground and the first power supply, wherein:

a first electrode and a gate electrode of the third transistor are electrically coupled to the first power supply and a second electrode of the third transistor is connected to the ground; and the third transistor is a n-type transistor.

7. The circuit of claim 1, further comprising a third transistor and an inverter, wherein:

an input of the inverter is connected to a first electrode of the third transistor;

an output of the inverter is connected to a gate electrode of the third transistor;

a second electrode of the third transistor is connected to the ground;

the inverter is configured to receive the first power supply voltage and convert the first power supply voltage to a second power supply voltage, and supply the second power supply voltage to the gate electrode of the third transistor;

the second power supply voltage being a complementary voltage of the first power supply voltage; and the third transistor is configured to discharge voltage or charge stored in the first power supply when the first power supply is switched off.

8. The circuit of claim 1, wherein the memory cell comprises:

a first inverter and a second inverter cross coupled with the first inverter, the first inverter and the second inverter being connected between the first power supply and the ground;

a first access transistor coupled between a second data line and the first node, the first node being between an output of the first inverter and an input of the second inverter; and a second access transistor coupled between a third data line and a third node, the third node being between an output of the second inverter and an input of the first inverter, wherein gate electrodes of the first access transistor and the second access transistor are connected to a second word line, the second word line crossing the second data line and the third data line, and wherein the first access transistor, the second access transistor, and the first bleeder transistor are n-type transistors.

9. A memory cell comprising:

a first logic gate configured to receive a first power supply voltage from a first power supply;

a first inverter cross coupled with the first logic gate;

a first access transistor coupled between a first data line and a first node, the first node being between an output of the first logic gate and an input of the first inverter; and a second access transistor coupled between a second data line and a second node, the second node being between an output of the first inverter and a first input of the first logic gate, wherein gate electrodes of the first access transistor and the second access transistor are connected to a first word line, wherein the first logic gate is configured to reset the memory cell in response to receiving a reset signal at a second input of the first logic gate when the first power supply is switched off.

10. The memory cell of claim 9, wherein the second input of the first logic gate is connected to a reset signal line configured to supply the reset signal to reset the memory cell when the first power supply is switched off or to reset the memory cell upon reboot when the first power supply is switched on.

11. The memory cell of claim 10, wherein the reset signal line is configured to receive the reset signal from a second circuit comprising a first transistor and a capacitor, wherein a first electrode of the first transistor is connected to a third data line and a second electrode of the first transistor is connected to a first electrode of the capacitor, wherein a gate electrode of the first transistor is connected to a second word line, and wherein a second electrode of the capacitor is connected to ground.

12. The memory cell of claim 9, wherein a portion of a memory array comprising a plurality of memory cells comprise a corresponding first logic gate to reset a corresponding memory cell in response to the reset signal when the first power supply is switched off.

13. The memory cell of claim 9, wherein the first logic gate comprises a first transistor, a second transistor, a third transistor, and a fourth transistor, wherein:

a first electrode of the first transistor is connected to the first power supply, a second electrode of the first transistor is connected to a first electrode of the second transistor, and a gate electrode of the first transistor is connected to the second node;

the first electrode of the second transistor is connected to the second electrode of the first transistor, a second electrode of the second transistor is connected to a first electrode of the third transistor and a first electrode of the fourth transistor, and a gate electrode of the second transistor is connected to a reset signal line configured to supply the reset signal, the first electrode of the third transistor is connected to the second electrode of the second transistor, a second electrode of the third transistor is connected to ground, and a gate electrode of the third transistor is connected to the reset signal line;

the first electrode of the fourth transistor is connected to the second electrode of the second transistor and the first electrode of the third transistor, a second electrode of the fourth transistor is connected to the ground, and a gate electrode of the fourth transistor is connected to the second node; and the first electrode of the third transistor and the first electrode of the fourth transistor are connected to the first node.

14. The memory cell of claim 9, further comprising a first transistor, wherein:

the input of the first inverter is connected to a first electrode of the first transistor;

the output of the first inverter is connected to a gate electrode of the first transistor;

a second electrode of the first transistor is connected to ground;

the first inverter is configured to receive the first power supply voltage and convert the first power supply voltage to a second power supply voltage, and supply the second power supply voltage to the gate electrode of the first transistor;

the second power supply voltage being a complementary voltage of the first power supply voltage; and the first transistor is configured to discharge voltage or charge stored in the first power supply when the first power supply is switched off.

15. A non-transitory computer readable medium storing a digital representation of a circuit comprising:

a memory cell connected to a first power supply configured to supply a first power supply voltage;

a first bleeder transistor coupled between a first node of the memory cell and ground;

a second circuit coupled to a gate electrode of the first bleeder transistor and configured to supply a bleeder signal to control the first bleeder transistor in response to a drop in the first power supply voltage; and a third transistor coupled between the ground and the first power supply, wherein the first bleeder transistor is configured to discharge the memory cell in response to receiving the bleeder signal, wherein a first electrode and a gate electrode of the third transistor are electrically coupled to the first power supply and a second electrode of the third transistor is connected to the ground; and wherein the third transistor is a n-type transistor.

16. The non-transitory computer readable medium of claim 15, wherein the second circuit comprises a first transistor and a capacitor, wherein a first electrode of the first transistor is connected to a first data line and a second electrode of the first transistor is connected to a first electrode of the capacitor, wherein a gate electrode of the first transistor is connected to a first word line, wherein a second electrode of the capacitor is connected to the ground, and the gate electrode of the first bleeder transistor is connected to the second circuit via a second transistor.

17. The non-transitory computer readable medium of claim 16, wherein:

a first electrode of the second transistor is connected to the second electrode of the first transistor and the first electrode of the capacitor;

the second electrode of the second transistor is connected to the gate electrode of the first bleeder transistor via a second node;

the gate electrode of the second transistor is connected to the first power supply voltage; and when the first power supply voltage is at a low level, the second circuit is configured to supply the bleeder signal to the gate electrode of the first bleeder transistor via the second transistor and the second node to turn on the first bleeder transistor.

18. The non-transitory computer readable medium of claim 16, wherein the second circuit is connected to one or more memory cells in a same row of a memory array comprising a plurality of memory cells, the one or more memory cells in the same row of the memory array being connected to a same word line, and wherein a portion of the plurality of memory cells of the memory array comprise a corresponding bleeder transistor to discharge a corresponding memory cell in response to the drop in the first power supply voltage.

19. The non-transitory computer readable medium of claim 15, further comprising an inverter, wherein:

an input of the inverter is connected to the first electrode of the third transistor;

an output of the inverter is connected to the gate electrode of the third transistor;

the inverter is configured to receive the first power supply voltage and convert the first power supply voltage to a second power supply voltage, and supply the second power supply voltage to the gate electrode of the third transistor;

the second power supply voltage being a complementary voltage of the first power supply voltage; and the third transistor is configured to discharge voltage or charge stored in the first power supply when the first power supply is switched off.

* * * * *